United States Patent
Zappella

(10) Patent No.: US 11,164,093 B1
(45) Date of Patent: Nov. 2, 2021

(54) ARTIFICIAL INTELLIGENCE SYSTEM INCORPORATING AUTOMATIC MODEL SWITCHING BASED ON MODEL PARAMETER CONFIDENCE SETS

(71) Applicant: Amazon Technologies, Inc., Seattle, WA (US)

(72) Inventor: Giovanni Zappella, Berlin (DE)

(73) Assignee: Amazon Technologies, Inc., Seattle, WA (US)

( * ) Notice: Subject to any disclaimer, the term of this patent is extended or adjusted under 35 U.S.C. 154(b) by 729 days.

(21) Appl. No.: 16/054,817

(22) Filed: Aug. 3, 2018

(51) Int. Cl.
| | |
|---|---|
| *G10L 15/22* | (2006.01) |
| *G10L 15/32* | (2013.01) |
| *G10L 15/26* | (2006.01) |
| *G06N 99/00* | (2019.01) |
| *G06Q 30/02* | (2012.01) |
| *G06N 5/04* | (2006.01) |
| *G06N 20/00* | (2019.01) |
| *G06F 30/20* | (2020.01) |

(52) U.S. Cl.
CPC ............. *G06N 5/045* (2013.01); *G06F 30/20* (2020.01); *G06N 20/00* (2019.01)

(58) Field of Classification Search
CPC ......... G06N 5/045; G06N 20/00; G06F 30/20
USPC ...................................................... 706/1–62
See application file for complete search history.

(56) References Cited

U.S. PATENT DOCUMENTS

| | | | | |
|---|---|---|---|---|
| 10,388,272 | B1 * | 8/2019 | Thomson | G10L 15/063 |
| 10,573,312 | B1 * | 2/2020 | Thomson | G10L 15/26 |
| 2014/0379619 | A1 * | 12/2014 | Permeh | G06F 9/5038 |
| | | | | 706/12 |
| 2016/0148099 | A1 * | 5/2016 | Micali | G06N 5/04 |
| | | | | 706/11 |
| 2018/0253496 | A1 * | 9/2018 | Natchu | H04L 67/02 |
| 2020/0034874 | A1 * | 1/2020 | Narayan | G06Q 30/0244 |
| 2020/0044996 | A1 * | 2/2020 | Johnson | H04L 51/046 |

(Continued)

OTHER PUBLICATIONS

Nathan Korda et al "Distributed Clustering of Linear Bandits in Peer to Peer Networks" dated Jun. 7, 2016, pp. 1-15.

(Continued)

*Primary Examiner* — Brandon S Cole
(74) *Attorney, Agent, or Firm* — Robert C. Kowert; Kowert, Hood, Munyon, Rankin & Goetzel, P.C.

(57) ABSTRACT

Computer systems and associated methods are disclosed to implement a model executor that dynamically selects machine learning models for choosing sequential actions. In embodiments, the model executor executes and updates an active model to choose sequential actions. The model executor periodically initiates a recent model and updates the recent model along with the active model based on recently chosen actions and results of the active model. The model executor periodically compares respective confidence sets of the two models' parameters. If the two confidence sets are sufficiently divergent, a replacement model is selected to replace the active model. In embodiments, the replacement model may be selected from a library of past models based on their similarity with the recent model. In embodiments, past models that exceed a certain age or have not been recently used as the active model are removed from the library.

20 Claims, 11 Drawing Sheets

(56) References Cited

U.S. PATENT DOCUMENTS

2020/0104362 A1* 4/2020 Yang .................. G06N 3/006
2020/0243094 A1* 7/2020 Thomson ............ G10L 15/26

OTHER PUBLICATIONS

Varsha Dani et al "Stochastic Linear Optimization Under Bandit Fedback" 2008 (21st Annual Conference on Learning Theory, 355-366).
Claudio Gentile et al "Online Clustering of Bandits" (Proceedings of the 31st International Conference on Machine Learning, Beijing, China, 2014, JMLR: W&CP vol. 31) pp. 1-9.
Yasin Abbasi-Yadkori "Improved Algorithms for Linear Stochastic Bandits" pp. 1-19.

* cited by examiner

MODEL SELECTION CONFIGURATION 600

RECENT MODEL IS: *610*

GENERATED EVERY 3000 DECISION STEPS

UPDATED BASED ON LAST 300 DECISION STEPS

REPLACE ACTIVE MODEL WHEN: *620*  [EDIT 625]

CONFIDENCE SET OVERLAP (ACTIVE MODEL, RECENT MODEL) < 0.10

SELECT REPLACEMENT MODEL FROM PAST MODELS WHERE: *630*  [EDIT 635]

PAST MODEL >= 1000 UPDATE STEPS AND

CONFIDENCE SET OVERLAP (PAST MODEL, RECENT MODEL) >= 0.75

☐ AVERAGE ALL QUALIFYING MODELS

☒ USE RECENT MODEL IF NO QUALIFYING MODEL FOUND

RETIRE PAST MODEL WHEN: *640*  [EDIT 645]

PAST MODEL IS OLDER THAN 1 YEAR OR

PAST MODEL HAS NOT BEEN ACTIVE FOR 6 MONTHS

ARTIFICIAL INTELLIGENCE SYSTEM INCORPORATING AUTOMATIC MODEL SWITCHING BASED ON MODEL PARAMETER CONFIDENCE SETS

BACKGROUND

Computerized sequential decision-making systems have become increasingly important in recent times. For example, such systems are increasingly being used to make machine-learned decisions in applications such as online marketing and content selection, system optimization, medical research, and other types of adaptive machine learning systems. A central challenge in such decision making is the explore-exploit dilemma: the need to balance exploration (i.e., collecting information for learning) and exploitation (i.e., making decisions to maximize a result). For example, in a content selection system, the system may seek to iteratively recommend content from a large set to a given user, aiming to maximize the relevance of the selections while at the same time to learn the preferences of the user. Many problems of this kind can be formalized as multi-armed bandit problems that are modeled using complex and structured decision spaces. The goal of such decision systems is to solve the explore-exploit dilemma with strong theoretical guarantees.

In some applications, the underlying nature of the modeled subject may be subject to unexpected changes. For example, a set of users being modeled by a content selection system may undergo a temporary change, so that their short-term preferences deviate drastically from the learnings of the model. In one example, user preferences may be changed by an external event, such as a news event. When such events occur, the content selection system may not perform optimally for some period of time, until it can adapt to the users' new preferences. Conventional efforts to detect and quickly react to such external events have led to systems that are overly complex (e.g., by using larger dimensions of model parameters) and resource demanding (e.g., by using faster learning rates). There is a general need in the field for a more practical solution to quickly adapt sequential decision models to a variety of model-changing events.

BRIEF DESCRIPTION OF THE DRAWINGS

FIG. 6 illustrates a graphical user interface that is used to configure model selection behavior in a sequential decision system, according to some embodiments.

Figure 1:
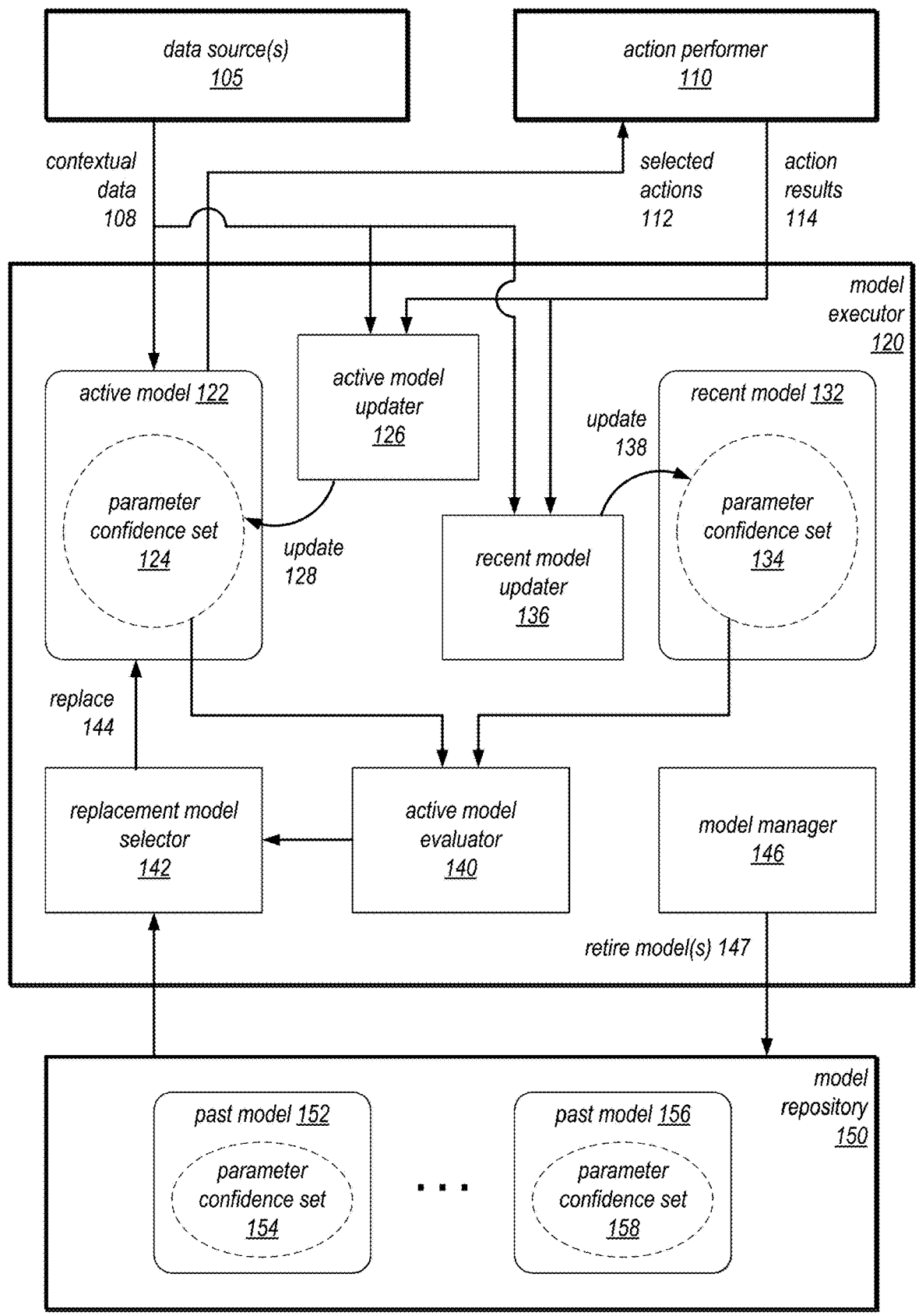
FIG. 1 is a block diagram illustrating an example sequential decision system that employs automatic model switching based on model parameter confidence sets, according to some embodiments.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

It will also be understood that, although the terms first, second, etc. may be used herein to describe various elements, these elements should not be limited by these terms. These terms are only used to distinguish one element from another. For example, a first contact could be termed a second contact, and, similarly, a second contact could be termed a first contact, without departing from the scope of the present invention. The first contact and the second contact are both contacts, but they are not the same contact.

DETAILED DESCRIPTION OF EMBODIMENTS

The systems and methods described herein may be used to implement a sequential decision system that automatically switches models based on their model parameter confidence sets.

Computerized sequential decision-making systems are becoming increasingly common in many applications such as online marketing and content selection, system optimization, medical research, and other types of adaptive machine learning systems. Sequential decision-making systems may be used in many different technical fields, including image processing, natural language processing, search processing, fault detection, error avoidance and correction, robotic control, autonomous vehicle control, to list a few examples. Such decision systems may be used to sequentially make decisions (for example, to select an action from an action set), while at the same time learn from the feedback of its decisions (for example, by updating a decision model). A goal in such decision systems is to solve the explore-exploit dilemma: the need to balance exploration (i.e., collecting information for learning) and exploitation (i.e., making decisions to maximize a result).

In general, a model used by a decision system implements a machine-executable function that can be invoked by a computer system to programmatically make decisions or select actions from input data. For example, a model may be executed by a computer to predict weather conditions for the next day, based on the weather conditions of previous days. In some embodiments, the model may comprise a number of model parameters. For example, in a linear model, the parameters may specify coefficients of a linear function that is applied to the input parameters. In some embodiments, the parameters may be dynamically adjusted by the computer system over time, based on ongoing evaluation of the model's performance. Such dynamically updated models are one example of machine learning models.

Depending on the application, computer models may be represented and stored in a variety of ways. In some embodiments, the model may be stored as a data structure that can be easily used by the computer to generate decision output. For example, in some cases, a model may be represented as a vector or a matrix of parameter values. The parameter values may be values that are used in the decision-making process itself, or other metadata used for other purposes. For example, in some cases the model parameters may include one or more values indicating a current confidence level or bound of the model. In some cases, a model may include memory units that store the ongoing state of the modeled subject or values derived from past inputs or outputs. In some cases, computer models may be stored as more complex data structures that specify relationships between the different parameters, such as trees, graphs, neural networks, or the like. In some cases, a model may include a combination of different types of data structures. In some cases, the structure of these models may change over time. In some cases, a model may be embedded as part of a computer-executable program or a set of hardware circuits, which may expose configurable model parameters, and be executed to carry out the decision-making functions of the decision system.

In some applications, the underlying nature of the modeled subject may be subject to unexpected changes. For example, in a content selection system that that selects content for users, a set of users being modeled by the system may undergo an unexpected temporary change (for example as a result of a new event), so that their short-term preferences deviate drastically from the learnings of the model. Thus, the content selection system may not perform optimally for some period of time, until it can adapt to the users' changed preferences. In general, conventional sequential decision systems do not perform well (e.g., do not select optimal actions) when faced when the modeled subject undergo unexpected short-term changes. In addition, conventional efforts to quickly detect and adapt to such external events have led to systems that are overly complex and resource demanding. In some cases, a single monolithic model designed to account for a large variety of modeled conditions may be prohibitively complex. In some cases, a decision system that must quickly detect underlying changes in the modeled subject may be required to make observations and perform model updates much more frequently. Even if such superior decision systems can be built, its execution may require extraordinary amounts memory, processing power, and processing time from the underlying computing systems.

Accordingly, embodiments of systems and methods disclosed herein implement a sequential decision system that automatically switches models based on their model parameter confidence sets. In embodiments, the decision system may periodically initiate a recent model alongside an active model of the system. The active model may be used to make decisions (e.g., select actions from an action set) at individual time periods or steps. In some embodiments, the system may receive results or feedback from the selected action and update the model parameters of the active model according to a sample of past actions and results, so that the active model is changing at the same time as it is being used to generate sequential decisions. In some embodiments, the updating at each time step may update a confidence set of the model parameters. In some embodiments, the model parameters at each time step may be selected from or based on the confidence set. For example, in some embodiments, the confidence set may comprise an ellipsoid (or some other type of volume in n-dimensional space) in the parameter space of the model. In some embodiments, the confidence set may be generated as an artifact of a decision step. In some embodiments, the confidence set may contain the optimal parameters for the model with a probability above a threshold probability.

In some embodiments, the recent model may be updated in parallel with the active model. However, in some embodiments, the recent model may not be used to make decisions at each decision step. Rather, the active model is used to make the decision, and its actions and the results of these actions are used to update the recent model. As its name suggests, the recent model may be updated based on just a recent window of data that is shorter than the active model's learning window. For example, in some embodiments, an active model may be a long-lasting model that is used by the decision system indefinitely until it is replaced, and the recent model may be a short-term model that is renewed frequently (for example weekly). As may be understood, the recent model is built from only the recent behaviors or characteristics of the modeled subject. In some embodiments, the recent model may learn more quickly about recent changes in the modeled subject than the active model, because the it is learning based on a smaller body of past observations.

In some embodiments, the respective confidence sets of the model parameters of the active model and the recent model are periodically compared. In some embodiments, when the comparison indicates that the two models are sufficiently different (e.g., the confidence sets of the two models no longer overlap), the decision system may cause the active model to be replaced with a replacement model. In some embodiments, a model replacement may be triggered when the overlap of the two confidence sets fall below a quantitative threshold. In some embodiments, the model replacement may be triggered based on a trend of past comparisons (e.g., when the overlap between the two confidence sets is decreasing over successive time periods, or decreasing in an accelerating fashion).

In some embodiments, once it is determined that an active model should be replaced, a replacement model is selected. In some embodiments, the recent model itself may be used as the replacement model. In some embodiments, the decision system may maintain a repository or library of past active models, which the replaced active model will also be stored in. In some embodiments, past models from the model repository or library may be evaluated to select one model that is the most similar to the recent model. For example, a past model is selected that best approximates the currently observed behaviors or characteristics of the modeled subject, as indicated by the recent model. This past model is then used as the replacement model. Thus, any further actions by the decision system are selected based on the replacement model, which is new active model.

Depending on the embodiment, the replacement model may be obtained in a variety of ways. In some embodiments, the decision system may determine a set of past models that are sufficiently similar to the recent model, based on their respective confidence set overlaps with the recent model. In some embodiments, any past model that has a confidence set overlap with the recent model may be included in the set. The past models in the set may then be combined to form a combined model, which is then used as the replacement model. For example, in some embodiments, several past models may be combined using an averaging technique, which may be average one or more model parameter values in order to generate the combined model. As may be understood, the combined model may combine the learnings of multiple past active models, so that the new model will perform well under currently observed conditions will high probability.

In some embodiments, the decision system may occasionally or periodically retire models from the model repository or library. In some embodiments, the decision system may attempt to preserve the best performing models, for example, maintain those models that have been most active over the recent past, and retire or delete those models that have not been highly active. In some embodiments, the past models may be scored based on how often it has been deemed "similar" with recent models (e.g., based on the aggregate amount of time that a given past model's parameter confidence set overlapped with a recent model's confidence set). By using this approach, the decision system is able to build a library of the most useful models in the recent past, while removing less useful models from the repository in order to save storage space. Over time, the decision system may converge on a small set of highly useful models. In some embodiments, the decision system may also implement a retirement policy wherein a model that is older than certain age (e.g., one year) is removed from the repository. In some embodiments, highly successful old models may become entrenched in the decision system, which prevents adequate exploration of the modeled subject under new conditions. Accordingly, in some embodiments, very old models may be deleted from the model repository, to force the decision system to relearn the modeled subject. In this manner, the decision system may maintain a truly dynamic set of past models.

In some embodiments, the decision system may implement a graphical user interface (GUI) that allows users to visualize the models managed by the system, including the active model, any recent model(s), and any past model(s). In some embodiments, the GUI may display the respective confidence sets of the different models and display their overlaps in a visual manner. In some embodiments, the GUI may also allow the changes of the confidence sets over time to be animated. In some embodiments, the GUI may also allow users to perform certain tasks manually, such as initiating a recent model, selecting a replacement model as the active model, or retiring past models. By present such visualizations to the user, the GUI is able to provide the user an intuitive understanding of the relationships between the different models, thereby simplifying the user's decisions in managing the models.

In some embodiments, the decision system may be hosted in a machine learning service, and the automatic model switching feature of the decision system may be provided as a configurable feature of the machine learning service. In some embodiments, the machine learning service may provide a configuration interface that allows users to easily configure various parameters associated with the model switching feature. For example, the configuration parameters may specify how often recent models are created, when an active model is to be replaced, and how to select a replacement model to replace the active model. In some embodiments, the configuration parameters may also specify how past models are managed and retired. Accordingly, the configuration interface allows users of the machine learning services to easily use and configure the automatic model switching feature.

As may be understood, the disclosed systems and methods improve upon conventional sequential decision systems to provide a highly performant, scalable, and configurable model switching feature that can dynamically detect changes in behaviors in a modeled subject and quickly switch models based on the detected changes. As one skilled in the art will appreciate in light of this disclosure, certain embodiments may be capable of achieving certain advantages, including some or all of the following.

In some embodiments, the model switching feature allows the decision system to detect in a timely fashion that the modeled subject has undergone an abrupt change. In some cases, this change may be difficult or impossible to detect in conventional systems given the scope of the modeling. By periodically evaluating the active model with recent models trained on a window of recent data, the decision system is able to quickly detect unexpected changes and adapt accordingly. This capability thus improves the decision-making performance of the system.

In another respect, the disclosed features allow the system to avoid the needless wasting of computing resources in updating the active model to short-term changes in the modeled subject. For example, in some conventional systems, models are regularly or frequently retrained regardless of any actual behavior changes in the modeled subject. This regular retraining of the model can be extremely expensive, consuming large amounts of compute power. The disclosed techniques allow the decision system to automatically detect changes in the modeled subject and retrain the model when it is needed.

In another respect, the disclosed features allow the system to learn and build a set of simple but highly useful models for a modeled subject, without having to create a single highly complex model for a large set of behaviors of the modeled subject. In many cases, a set of smaller models allows the decision system to perform more optimally than a single large model. More practically, by using smaller models, the decision system is able to reduce the amount of processing power, memory, and storage space that would be necessary to execute and maintain the larger model. In some embodiments, the model switching may be piggybacked on the existing operations of the decision step to update the parameter confidence sets, so that the updating of the confidence sets adds little or no overhead to the existing operations of the decision system.

In another respect, by maintaining and reusing past models, the decision system does not need to constantly retrain or update models for every new data condition encountered. When a new data condition is detected, the decision system can instantly and seamlessly switch to a past model that has already been trained under similar conditions. This reusing of old models further reduces resource usage of the decision system. Moreover, the switch to the new model can be performed immediately. This improves upon conventional decision systems, where in some cases, the system must expend significant amounts of time to adapt its model before the model begins to perform well under changed data conditions, resulting in a period of bad performance.

In some embodiments, the model switching feature may be implemented as a fully configurable user service, which may be used to complement a variety of different modeling systems. In some embodiments, the service may be run in the background to perform its functions automatically without any human intervention. In some embodiments, the decision system may include one or more configuration interfaces to configure the parameters of the service. In some embodiments, the configuration interfaces may allow a user to easily understand and configure the model switching process. In some embodiments, the decision system may include a visualization interface that can graphically depict the models in the system and their model parameter confidence sets, so as to allow the user to better visualize and understand the models as the user manually makes changes to the models. These and other features and benefits of the inventive system and method are described in more detail below, in connections with the figures.

FIG. 1 is a block diagram illustrating an example sequential decision system that employs automatic model switching based on model parameter confidence sets, according to some embodiments. As shown, the sequential decision system may include an action performer 110, a model executor 120, and a model repository 150. The model executor 120 may be configured to maintain a model (e.g., active model 122), which is used to make the decisions of sequential decision system. In some embodiments, the sequential decision system may be hosted on one or more computer systems, such as the computer system illustrated in FIG. 10.

As shown, the model executor 120 may receive input data from one or more data sources 105 and feed the input data into the active model 122. In some contexts, the input data may be referred to as contextual data 108. Depending on the embodiment, the data sources 105 may include different data stores such as data repositories, data sensors or gathering equipment, data receiving interfaces or equipment, data generators, or the model subject itself (e.g., a user). In some embodiments, model 122 may be configured to make its decision from the contextual data 108. For example, in some embodiments, execution of the active model 122 may involve multiplying a vector of model parameters with a vector of contextual data parameters. As one example, a model may be used to model the song preferences of individual users, and the contextual data 108 may include the characteristics of the individual persons, such as their age, gender, indicated preferences, etc. As another example, a model configured to detect erratic driving behavior may receive contextual data that includes the car's speed, the driver's breaking force, and the driver's eye movements. Depending on the model, the contextual data may include any of a variety of input data (e.g., the current time, a count, a configured state of the decision system), other than the actual results of the actions.

As shown, the model executor 120 may interact with an action performer 110. In some embodiments, the action performer 110 may represent an interface between the model executor 120 and the world where the executor's selected actions 112 are carried out. The selected actions 112 may include a variety of actions such as output of predictions, classifications, recommendations, parameter adjustments, or control signals, just to name a few examples. In some embodiments, the action performer 110 may return action results 114 to the model executor 120, which may be used by the executor to update its models, as shown. In some embodiments, the action performer 110 and the model executor may be hosted on different computer systems.

The illustrated decision system may be used in a variety of applications. For example, in some embodiments, the decision system may be used to implement a content selection system, where the models (e.g., models 122 and 132) are used to model one or a set of users who may be interested in acquiring items. In some embodiments, the model executor 120 may make decisions on what content to recommend to a user, and the results 114 may include feedback indicating whether the recommendations were accepted. In one particular example, the content may include songs that a user may be interested in. The action performer may compose a playlist of songs for the user, and the user may indicate feedback 114 including whether the user liked or disliked a song, whether the user listened to the song to completion or not, etc. The model execution 120 may then take this feedback and updates its models for the user to inform the models future selection of songs. This sort of sequential decision system is designed to solve a classic example of exploration-exploitation problem, where the system is at the same time attempting to learn about the user (exploration) and also provide the best songs to the user (exploitation). As may be understood, in such a model, the model is at the same time being used to make decisions and also updated in light of the results of the decisions.

As shown, in some embodiments, the model executor 120 may update two models, an active model 122, and a recent model 132. The active model 122 may be used to make the decisions of the system, such as the selected actions 112. The decisions or action will generate results 114, which are then provided back to the model executor 120 to update 128 the active model 122 and update 138 the recent model 132. As shown, in this example, the active model is updated 128 by the active model updater 126, and the recent model is updated 138 by the recent model updater 136. As shown, in some embodiments, the updating 128 and 138 may also depend on the contextual data 108, which was originally used to generate the selected action 112. In some embodiments, the two updaters may be implemented within the same component in the executor 120. In some embodiments, the two updates may be performed in parallel, for example, within the same time step for the decision system. For example, the decision system may generate a decision (e.g., a selected song) for in each time step, and both of the models 122 and 132 may be updated in the time step.

In some embodiments, the recent model 132 may represent a model that has only been updated for a short period of time as compared to the active model 122. For example, in some embodiments, the active model may persist for a long time (e.g. months) before it is replaced, and a recent model may have existed only for a week. In some embodiments, the model executor 120 may generate a new recent model 132 periodically (e.g., once per week), so as to determine the recent behavior of the modeled subject (e.g., the user listening to the songs). When the recent model 132 abruptly deviates from the active model 122, this condition may indicate a change in the behavior of characteristics of the modeled subject. For example, in the song example, the user may have recently begun to listen to more slow music, which is a departure from the user's past preferences for fast music. In some embodiments, the recent model may be configured to "forget" old learnings, for example, by limiting its updates to be based on only a window of the most recent actions of the active model and corresponding results. Thus, for example, although the recent model may persist for a month, its parameters and confidence set may only reflect the actions and results of the last week. In this manner, the recent model can remain sensitive to subtle changes in the modeled subject. In some embodiments, the active model may also be limit its updates to a window of data in this manner. However, in some embodiments, the window for the active model may be much longer.

As shown, in some embodiments, the models 122 and 132 may include a parameter confidence set 124 and 134, respectively. In some embodiments, the models 122 and 132 may be represented as a set of model parameters, which are used to make the model's decisions. For example, the model 122 and 132 may be expressed in terms of a function, such as a linear function, and the model parameters may be the weights or coefficients of the linear function. In some embodiments, the two models 122 and 132 employ the same set of model parameters.

In some embodiments, the model parameter sets may comprise a "Confidence Ball," as described in Dani, Varsha, Hayes, Thomas P., and Kakade, Sham M., Stochastic linear optimization under bandit feedback. In COLT, pp. 355-366, 2008. In some embodiments, the Confidence Ball or confidence set may be computed from a set of past actions chosen by the model and their corresponding results, as explained in the Dani paper. The Confidence Ball or confidence set may represent a confidence region for the set of model parameters in the parameter space, which may have the shape of an ellipsoid centered around a vector of estimate values for the model parameters. In some embodiments, the Confidence Ball or confidence set is calculated so that it probabilistically contains the optimal set of model parameters of the model, above a certain probability threshold. In some embodiments, the Confidence Ball or confidence set may be maintained by the model over successive decision steps, and updated at each decision or update step of model execution. In some embodiments, the decisions of the model at each step are made using a vector of model parameter values selected from the Confidence Ball or confidence set. In some cases, different variations of confidence sets (e.g., as discussed in the Dani paper) may be used. For example, in some embodiments, the confidence set may take a different shape, such as a bounding octahedron. Additional details and examples of confidence sets in the context of these models are discussed in the Dani paper, which is incorporated by reference in its entirety herein.

In some embodiments, the confidence set may indicate not just what model parameter values are included in the set, but also the relative probabilities of the values. For example, in some embodiments, the confidence set may comprise a probability distribution of parameter values for an individual model parameter, or the values of various combinations of model parameters. In some embodiments, the probability distribution may be a posterior distribution of the parameters, given some number of observations (e.g., results of selected action) seen by the model. In some embodiments, this posterior distribution may be calculated as part of the decision-making process. In some embodiments, the posterior distribution may be calculated separately from the decision-making process, for example, once every 10 or 100 decision steps. In some embodiments, the posterior distribution of both the active model and the recent model may be calculated, based on their different observation windows. For example, the recent model's parameter posterior distribution may be computed based on a much smaller window of recent observations. In some embodiments, the similarity of two models may be determined based on the overlap of the posterior distributions of their parameters. In some embodiments, the past models may be activated and/or retired based on the characteristics of their posterior distributions. In some embodiments, the shape of the posterior distribution may be used as a factor to select or retire past models. For example, a model with a tighter posterior distribution (suggesting high confidence for a particular parameter set) may be selected over a model with a flatter posterior distribution. As discussed, as the model execution continues to execute the active model, both the active model 122 and the recent model 132, and their respective confidence sets 124 and 134, are updated based on the received action results 114. Whereas the confidence set 124 of the active model is adjusted based on the active model's long-term experience, the confidence set 134 of the recent model is adjusted based on just the recent feedback received from the active model's recent actions. Accordingly, any changes in the model subject may be detected much more quickly in the recent model, and such changes may be manifested much more in the recent model.

As shown, in some embodiments, the two confidence sets 124 and 134 may be used by an active model evaluator 140. In some embodiments, the active model evaluator 140 may perform a comparison of the two confidence and make a determination as to whether the active model 122 should be replaced. In some embodiments, the criteria to replace the active model may be configurable via a configuration interface of the model executor 120. In some embodiments, a replace of the active model may be triggered when the two confidence sets no longer overlap. Since the confidence sets represent confidence regions where the true parameters of the model should lie, their divergence indicates that the active model is temporary not performing optimally. Accordingly, as shown, the active model evaluator 140 may cause a replace model selector 142 to select a new model to replace the active model 122.

In some embodiments, the replacement condition employed by the active model evaluator 140 may include different threshold or different factors. For example, in some embodiments, the evaluator may cause the active model to be replace when its confidence set overlap with the recent model's confidence set falls below a threshold. In some embodiments, the replacement may not be triggered unless the confidence sets do not sufficiently overlap for a number of successive update steps. In some embodiments, the evaluator may take into account the movement of the two confidence sets over successive decision steps. For example, in some embodiments, the evaluator may be more likely to trigger a model replacement if the divergence between the two confidence sets is growing over successive steps.

As shown, in some embodiments, the model executor 120 may implement a replacement model selector 142, which may be responsible for selecting a model to replace the active model, once it is determined that the active model should be replaced. In some embodiments, the selector 142 may select the replacement model from a model repository 150 of past models, such as models 152 and 156. In some embodiments, models that have been used as active models (but have been replaced) and kept in the model repository 150 for a period of time, so that they may be activated again under the right conditions. Thus, when the active model 122 is replaced, in some embodiments, it is stored in the model repository 150.

In some embodiments, the replacement model selector 142 may compare the confidence sets of past models, such as confidence sets 154 and 158, with the confidence set 134 of the recent model. Thus, the selector 142 is able to determine a past model that is the most similar to the recent model 132, which reflects the current behavior and characteristics of the modeled subject. In some embodiments, the comparison may involve determine a degree of overlap between the confidence set of the past model and the confidence set of the recent model. If the overlap exceeds a certain threshold, the past model may be selected as the replacement model. In some embodiments, the selector 142 select a set of multiple past models that are sufficiently similar to the recent model 132, and select one past model from the set based on certain criteria, which may be configurable by the user. For example, in some embodiments, a single past model may be selected based on a score that is dependent on the model's overlap with the recent model, the model's age, the degree to which the model has been recently active, etc.

In some embodiments, the replacement model selector 142 may in some cases combine multiple past models to create a combined model, which is then used as the replacement model. In some embodiments, the selector 142 may combine multiple models when multiple past models are sufficiently similar to the recent model, or when the degree of similarity of multiple past models with the recent model are relatively close. In some embodiments, all past models with confidence sets that overlap with the recent model's confidence set may be combined. In some embodiments, the combination may be performed via an averaging technique. For example, in some embodiments, the model parameters of the combined model may be average via a weighted averaging, where models with more experience are favored with larger weights. In some embodiments, the combined models may be weighted according to other factors such as their age, their similarity to the recent model, among other things.

In some embodiments, the replacement model selector 142 may use the recent model 132 itself as the replacement model. In some embodiments, the recent model may be used as the replacement model if no past models in the repository 150 meets a baseline threshold for the replacement model. For example, in some embodiments, the recent model may be used if no past models in the repository are sufficiently similar to the recent model. As shown, once a replacement model is selector or generated, the active model 122 is replaced 144. Thus, any further decisions or actions of the model executor 120 will be made or selected according to the replacement model. The replacement model will take the role of the former active model 122 and be updated based on further action results 114. As discussed, former active model may be stored to the model repository 150, where it will not be updated until it is made active again in the future.

As shown, in some embodiments, the model executor 120 may implement a model manager 146. In some embodiments, the model manager 146 may be tasked with managing the past models in the model repository 150, which may include occasionally or periodically retiring models 147 from the repository. In some embodiments, retiring a past model may comprise deleting the model from the repository. In some embodiments, the model manager 146 may not operate as part of the model executor 120. In some embodiments, the model manager 146 may be implemented as a separate system, which may retire models from the repository automatically based on configurable conditions. In some embodiments, the model manager 146 may provide a graphical user interfaces so as to allow a user to manually examining the past models and remove them from the repository 150.

Depending on the embodiments, past models may be retired from the repository based on a number of conditions. As discussed, in some embodiments, such retirement conditions may be configurable by the user. In some embodiments, models that are older than a certain age (e.g., one year) may be retired. Such a policy may be helpful to remove certain entrenched models in the system, which may not optimal but persist in the system for one reason or another. Periodic removal of such models forces that the decision system to relearn the model subject over time. In some embodiments, a past model that has not been used as an active model in a threshold period of time (e.g., the past six months) may be removed from the repository. As may be understood, models that have not been active are likely to not be very useful to the system given the modeled subject's recent behavior. Removal such models reduces space usage by the model repository and simplifies the model selection that must be performed by the selector 142, for example. In some embodiments, other considerations or factors may be used to retire models from the repository. For example, in some embodiments, the aggregate length of time that a model has been active in the past may be used as a factor. In some embodiments, each model may be scored by the selector 142, so that each time it is deemed sufficiently similar to a recent model 134, the score for the model may be incremented. This score may be used to determine whether or not the past model should be removed. In some embodiments, a past model may be designed by a user as a model that should not be removed from the system. For example, the user may designate a particular model as a useful special case model (e.g., Christmas model). With this designation, the model may never be removed by the model manager 146, even if it is rarely used.

Figure 2:
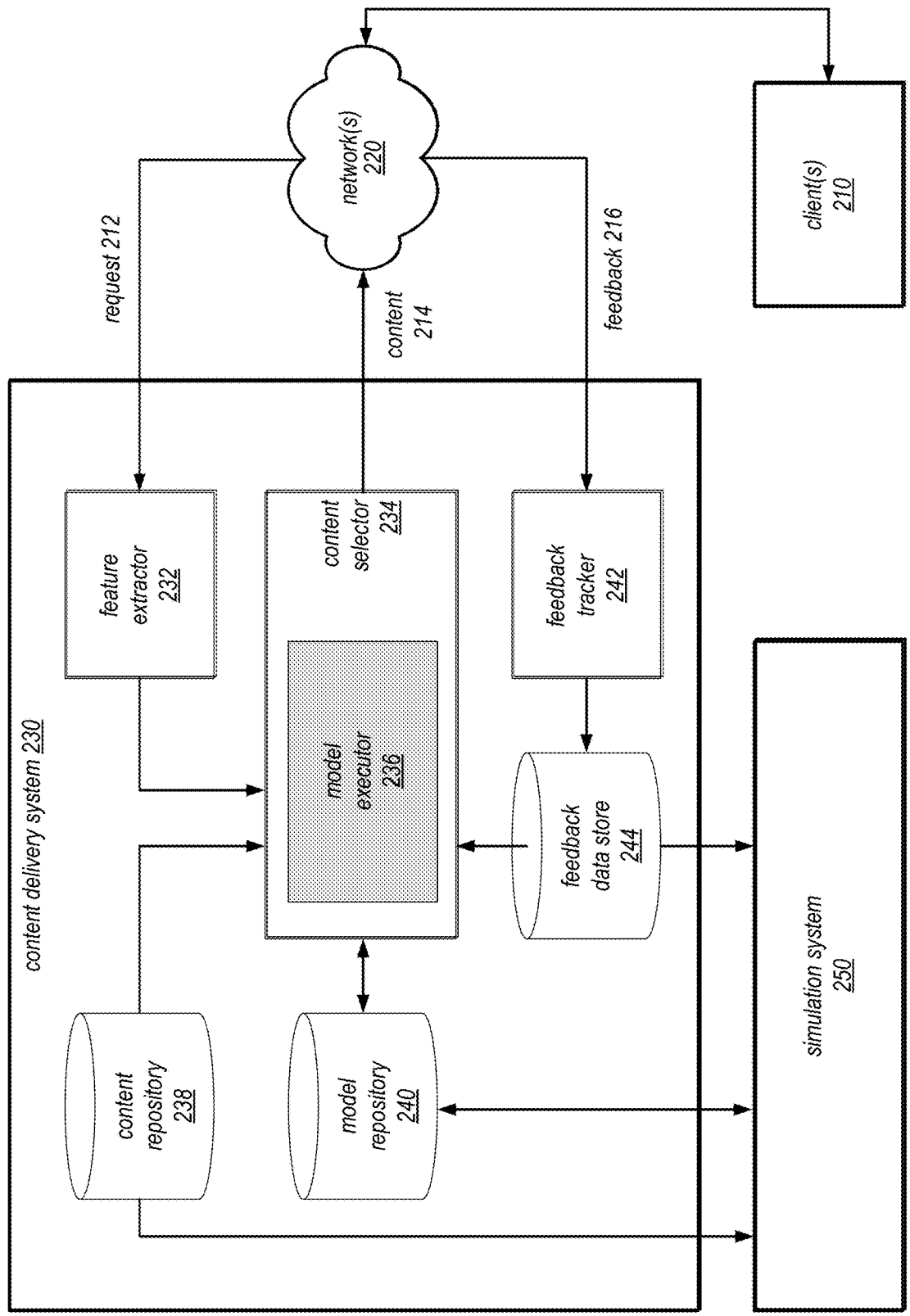
FIG. 2 is a block diagram illustrating an example sequential decision system used to select content for a content delivery system, according to some embodiments.

FIG. 2 is a block diagram illustrating an example sequential decision system used to select content for a content delivery system, according to some embodiments. The system of FIG. 2 represents one example use case of the disclosed sequential decision system of FIG. 1.

As shown, the content delivery system 230 may interact with one or more clients 210 over one or more networks 220. At a high level, the client 210 may send a request 212 for content to the content delivery system 230. The content delivery system 230 may in turn provide content 214 to the client. In some embodiments, the content may be selected (or include portions that are selected) or the client. For example, the content may include a selected song for the client. As another example, the content may be a webpage that include a selected item (e.g., a news story) for the client. After the content is delivered, the client 210 may provide some feedback 216 back to the system, which may be used to update the content selection model for the client. For example, the feedback may include how long a user listened to a song selected by the system 230, or whether the client indicated interest to (e.g. clicked on) an item recommendation selected by the system 230. Thus, content delivery system 230 implements a sequential decision system that serially selects content for the client 210 using a selection model and at the same time updates the selection model based on feedback.

The content delivery system 230 may provide computing resources to deliver content to the client(s) 210. The content delivery system 230 may be operated by an entity to provide one or more types of content, such as webpages or multimedia content, accessible via the Internet and/or other networks to client(s) 210. In some embodiments, the service provider network 230 may implement a web server, for example hosting an e-commerce website. In some embodiments, content provider system 230 may include numerous data centers hosting various resource pools, such as collections of physical and/or virtualized computer servers, storage devices, networking equipment and the like, needed to implement and distribute the infrastructure and services offered by the system.

The client(s) 210 may encompass any type of client configurable to submit requests to the content delivery system 230. For example, a given client 210 may include a suitable version of a web browser or may include a plug-in module or other type of code module configured to execute as an extension to or within an execution environment provided by a web browser. Alternatively, a client 210 may encompass a client application such as a dashboard application (or user interface thereof), a media application, an office application or any other application that may make use of the computing resources to perform various operations. In some embodiments, such an application may include sufficient protocol support (e.g., for a suitable version of Hypertext Transfer Protocol (HTTP)) for generating and processing network-based services requests without necessarily implementing full browser support for all types of network-based data.

The client(s) 210 may convey network-based services requests to the content delivery system 230 via network 220. In various embodiments, network 220 may encompass any suitable combination of networking hardware and protocols necessary to establish network-based communications between clients 210 and content delivery system 230. For example, a network 220 may generally encompass the various telecommunications networks and service providers that collectively implement the Internet. A network 220 may also include private networks such as local area networks (LANs) or wide area networks (WANs) as well as public or private wireless networks. For example, both a client 210 and the content delivery system 230 may be respectively provisioned within enterprises having their own internal networks. In such embodiments, the network 220 may include the hardware (e.g., modems, routers, switches, load balancers, proxy servers, etc.) and software (e.g., protocol stacks, accounting software, firewall/security software, etc.) necessary to establish a networking link between the client 210 and the Internet as well as between the Internet and content delivery system 230. In some embodiments, client(s) 210 may communicate with content delivery system 230 using a private network rather than the public Internet.

As shown, a request 212 sent by the client 210 may first be processed by a feature extractor 232. As an example, the request can be a content page request, and the content delivery system 230 can therefore use the request to determine what individual content or combination of content should be displayed in a content page and/or how the individual content or content combination should be displayed in the content page. In some embodiments, the request may include contextual information, or may include a session ID or cookie that can be used to look up contextual information. Thus, in some embodiments, the feature extractor 232 can extract features from the contextual information, which may be used as contextual data 108 as discussed in FIG. 1. The feature extractor 232 can generate a feature vector with the extracted features, where each element in the feature vector corresponds to a different extracted feature. The feature extractor 232 can then transmit the feature vector to the content selector 234, which then makes a selection decision to select a content to service the request.

In some embodiments, the content selector 234 may employ a model executor 236, which may comprise the model executor 120 as discussed in connection with FIG. 1. In some embodiments, the model executor 236 may implement a content scorer to score content selected from a content repository 238. For example, such content may include content such as videos, songs, news stories, etc. In some embodiments, the selection may also include instructions or strategies on how to display certain content, not to display certain content, and/or to display content in a certain manner, and/or configuration or formatting of content for display.

As discussed, the model executor 236 may periodically update an active model and a recent model, where the active model is used to make the selection decision. In some embodiments, when respective confidence sets of the active model and the recent model deviate by a sufficient degree, the active model may be replaced. In some embodiments, the replacement model may be chosen or generated from past models store in a model repository 240, as shown. In some embodiments, a replaced active model is placed in the model repository 240, where it will remain dormant until it is selected again as the active model.

As shown, in some embodiments, selected content 214 is delivered to the client 210, which may then display the content for a user. For example, in the context of content page requests, the client 210 can render a content page and display certain content, not display certain content, and/or display content in a certain way in the rendered content page in response to receiving the content.

As a result of displaying the content, a user operating the client 210 may or may not perform a resulting action. For example, in the context of content page requests, a user may click on a link in displayed content, a user may access a content page associated with an item depicted in the displayed content, a user may indicate a dislike for an item depicted in the displayed content, a user may perform no action, and/or the like. The client 210 can capture the action of the user and provide feedback 216 to the content delivery system 230.

As shown, in some embodiments, the feedback 216 may be received by a feedback tracker 242. The feedback tracker 242 may then store the feedback data in a feedback data store 244, as shown. In some embodiments, each entry in the feedback data store 244 is associated with a prediction ID, which may include or be used to refer to the extracted features, the selected content (or an identifier of the selected content), or the resulting user behavior (represented as the feedback data).

In some embodiments, the model executor 236 may update selection model (e.g., both the active and the recent models) based on the received feedback 216. In some embodiments, the updating may be based on a combination of extracted features, selected content, and resulting user feedback. In some embodiments, the models may be updated each time new entries are added to the feedback data store 244, periodically in batches (e.g., after a certain number of entries have been added to the feedback data store), or at other times. Thus, in the context of content page requests, as the clients provide feedback to delivered content pages, the model executor 236 can update the models to more adapt to expected results, which ultimately improves the quality or value of future content selections made by the content selector 234.

In some embodiments, the system may also include a simulation system 250, which may or may not be part of the content delivery system 230. In some embodiments, while the content delivery system 230 and the model executor 236 operate in the production environment, the simulation system 250 may run on an experiment system in a separate test environment to test different policies or models before such policies or models are used by the content delivery system 230. In some embodiments, the both environment may have access to one or more of the data stores 238, 240, or 244. In some embodiments, the models under test in the simulation environment may be kept distinct from the model(s) being used in the production environment via one or more metadata attributes in the model repository 240. In some embodiments, the active model of the content delivery system may be designed a production model, while one or more of the past models may be designated as test models. In some embodiments, the recent model that is updated alongside the active model may also be designated as a test model. In some embodiments, the recent model may be updated by the simulation system 250, so that the monitoring of the active model does not incur excessive resource overhead in the production environment. In some embodiments, the simulation system 250 may update multiple past models in parallel with the active model, when the past model(s) are sufficiently similar with the recent model. In this manner, the simulation system 250 may continue the training of multiple selection models in a separate environment, where they may be developed using targeted training data and more closely analyzed by model developers or system administrators.

Figure 3:
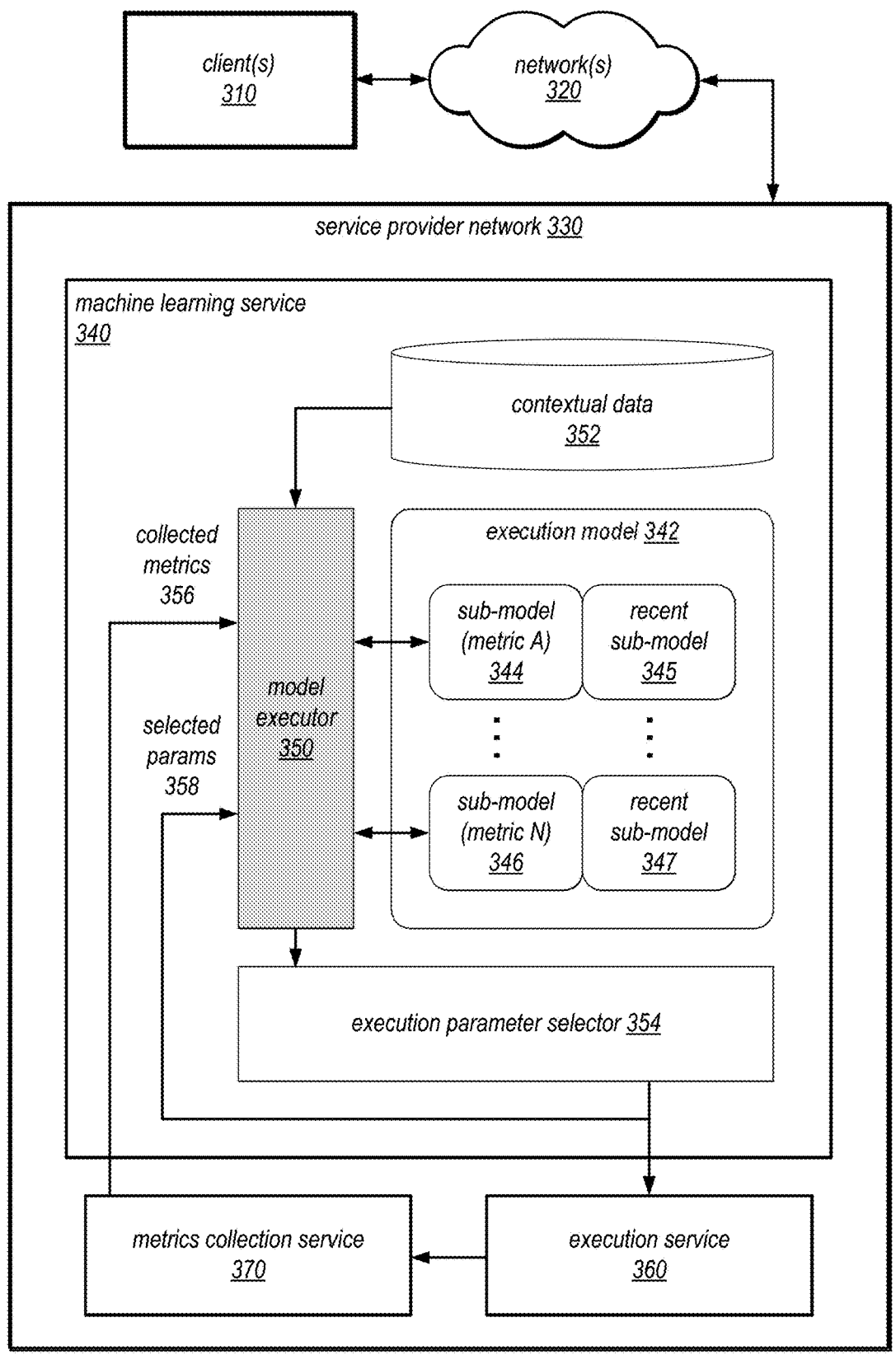
FIG. 3 is a block diagram illustrating an example sequential decision system hosted in a machine learning service and used to select execution parameters for an execution system, according to some embodiments.

FIG. 3 is a block diagram illustrating an example sequential decision system hosted in a machine learning service and used to select execution parameters for an execution system, according to some embodiments. The system of FIG. 3 represents another example use case of the disclosed sequential decision system of FIG. 1.

As shown, the figure depicts a service provider network 330 that may interact with one or more clients 310 over one or more networks 320. The service provider network 330 may provide computing resources via one or more computing services to the client(s) 310. The service provider network 330 may be operated by an entity to provide one or more services, such as various types of cloud-based computing or storage services, accessible via the Internet and/or other networks to client(s) 310. In some embodiments, the service provider network 230 may include numerous data centers hosting various resource pools, such as collections of physical and/or virtualized computer servers, storage devices, networking equipment and the like, needed to implement and distribute the infrastructure and services offered by the service provider network 330. In some embodiments, service provider network 330 may provide computing resources to clients. These computing resources may in some embodiments be offered to client(s) 310 in units called "instances," such as virtual compute instances.

The clients 310 may operate in similar fashion as clients 210 discussed in FIG. 2. In some embodiments, the client(s) 310 may be configured to generate network-based services requests according to a Representational State Transfer (REST)-style network-based services architecture, a document- or message-based network-based services architecture, or another suitable network-based services architecture. In some embodiments, the service provider network 330 may offer its services as web services, and the client(s) 310 may invoke the web services via published interfaces for the web services. In some embodiments, a client 310 (e.g., a computational client) may be configured to provide access to a computing service 330 in a manner that is transparent to applications implemented on the client(s) 310 utilizing computational resources provided by the service provider network 330. The network 320 may operate in similar fashion as network 220, as discussed in connection with FIG. 2.

As shown, in some embodiments, the service provider network 330 may host a plurality of different services for the client(s) 310. For example, some of these services may include a machine learning service 340, an execution service 360, and a metrics collection service 370, as shown. In some embodiments, one or more of these services may be implemented within or as a part of another service.

In some embodiments, the machine learning service 340 (MLS) may implement a set of programmatic interfaces (e.g., APIs, command-line tools, web pages, or standalone GUIs) that can be used by client(s) 310 to submit requests for a variety of machine learning tasks or operations. The machine learning service 340 may include a control plane that comprises a plurality of components (including a request handler, workload distribution strategy selectors, one or more job schedulers, metrics collectors, and modules that act as interfaces with other services). The data plane of the MLS may include, for example, a resource pool, storage devices that are used to store input data sets, intermediate results or final results (some of which may be part of the MLS artifact repository), and the network pathways used for transferring client input data and results.

In some embodiments, a job object submitted to the MLS 340 may indicate one or more operations that are to be performed as a result of the invocation of a programmatic interface, and the scheduling of a given job may in some cases depend upon the successful completion of at least a subset of the operations of an earlier-generated job. In at least some implementations, the MLS job queue may be managed as a first-in-first-out (FIFO) queue, with the further constraint that the dependency requirements of a given job must have been met in order for that job to be removed from the queue. In some embodiments, jobs created on behalf of several different clients may be placed in a single queue, while in other embodiments multiple queues may be maintained (e.g., one queue in each data center of the provider network being used, or one queue per MLS client). After the processing plan has been generated and the appropriate set of resources to be utilized for the job has been identified, the job's operations may be scheduled on the resources. Results of some jobs may be stored as MLS artifacts within a results repository in some embodiments.

In some embodiments, client requests may result in the immediate generation, retrieval, storage, or modification of corresponding artifacts within MLS artifact repository by the MLS request handler. A client request may also indicate one or more parameters that may be used by the MLS to perform the operations, such as a data source definition, a feature processing transformation recipe, or parameters to be used for a particular machine learning algorithm. In some embodiments, artifacts respectively representing the parameters may also be stored in MLS repository. Some machine learning workflows, which may correspond to a sequence of API requests from a client, may include the extraction and cleansing of input data records from raw data repositories (e.g., repositories indicated in data source definitions) by input record handlers of the MLS.

The output produced by the input record handlers may be fed to one or more feature processors, where a set of transformation operations may be performed in accordance with recipes using another set of resources from the resource pool. The output of the feature processing transformations may in turn be used as input for a selected machine learning algorithm, which may be executed in accordance with algorithm parameters using yet another set of resources from the resource pool. A wide variety of machine learning algorithms may be supported natively by the MLS libraries, including for example random forest algorithms, neural network algorithms, stochastic gradient descent algorithms, and the like. In at least one embodiment, the MLS may be designed to be extensible—e.g., clients may provide or register their own modules (which may be defined as user-defined functions) for input record handling, feature processing, or for implementing additional machine learning algorithms than are supported natively by the MLS.

As shown, in the depicted example, the machine learning service 340 is used to host an execution model 342, which is used by an execution parameter selector 354 to select execution parameters for an execution service 360. In some embodiments, an execution service 360 may expose many configurable execution parameters, and these parameters may be adjusted programmatically based on conditions of the system to optimize one or more execution results, for example, to reduce latency or processor or memory utilization. For example, in some embodiments, the execution system may periodically instantiate virtual machine instances to perform certain tasks associated with a hosted client application. In these embodiments, the machine learning service 340 may host an execution model 342 to learn the most optimal execution parameter settings for the execution service 360. In some embodiments, these execution result may be captured as execution metrics by metrics collection service 370, which then reports the metrics back to a model executor 350, as shown.

In some embodiments, the model executor 350 may receive the collected metrics 356 as feedback, and use this feedback and the selected parameters 358 of previous decision steps to update the execution model 342, so as to find the parameter settings that optimizes the set of collected metrics, according to a policy. For example, model may strive to reduce execution latency as one metric, and also to improve an application-specific performance measure as a second metric. In some embodiments, the model executor may also receive contextual data 352, as shown, and use this contextual data to generate information for an execution parameter selector 354. In some embodiments, this contextual data may be obtained from a variety of sources and include data that is relevant to the output of the model executor 350. For example, the contextual data 352 may include different characteristics of the hosted application or the execution environment. The contextual data 352 may also include a current condition (e.g. current CPU utilization level or current request queue backlog) of the execution environment. In some embodiments, the contextual data may include an application profile that describes various aspects of a client application hosted in the execution service 360. In some embodiments, the contextual data may specify the type of an incoming request that is to be submitted to the execution service.

In some cases, the behavior or characteristic of the hosted application (or hosting resources in the execution service 360) may temporarily change unexpectedly. For example, the execution service 360 may undergo a maintenance process during which it is resource constrained. As another example, a hosted application may behave in one of three operating states, and the optimal execution parameter settings are different for the three operating states. In such cases, the model executor 350 may implement an embodiment of the model executor 120 as discussed in FIG. 1. For example, the model executor 350 may occasionally initiate a recent model, compare the resent model to an active model, and if the two are sufficiently different (e.g., when their model parameter confidence sets do not sufficiently overlap), replace the active model with another model that is more similar to the recent model.

As shown, in some embodiments, the execution model 342 may comprise multiple sub-models 344 and 346, for example, one sub-model for each execution metric. In some embodiments, the model executor 350 may maintain a respective recent model 345 and 347 for each metric sub-model. The recent models 345 and 347 may be maintained in similar fashion as discussed for the model executor 120 of FIG. 1. In the depicted example, each metric sub-model may be evaluated (and replaced) independently from the other metric sub-models. As shown, the model executor 350 may use these sub-models to generate an execution result (e.g., a score or a result vector), which may be provided to the execution parameter selector 354 to select a next set of execution parameters. For example, in some embodiments, the selector 354 may rank different candidate parameter settings according to scores provided by the model executor 350.

As may be understood, by employing the depicted system, the client is spared from having to identify a precise set of execution parameters for its hosted application. Rather, the client may specify a simple policy that indicates certain execution goals in terms of execution metrics. The machine learning service 340 can then take the simple policy and learn the optimal execution parameters for the hosted application. When the client application or hosting resources undergo temporary changes, the machine learning service 340 can quickly detect the change and replace the active model with a better-performing model. Over time, the machine learning service is able to generate a set of highly useful models that are adapted to different operating conditions of the execution system.

FIGS. 4A to 4D illustrate stages in a model replacement process implemented in a sequential decision system, according to some embodiments.

Figure 4A:
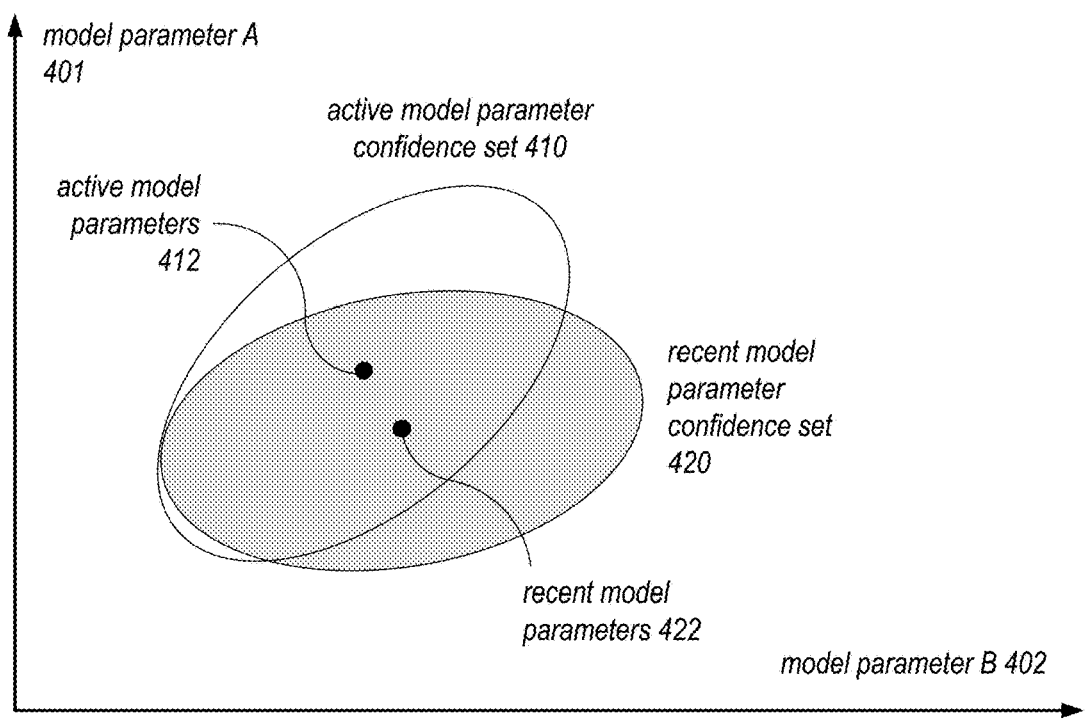
FIGS. 4A to 4D illustrate stages in a model replacement process implemented in a sequential decision system, according to some embodiments.

As shown, the stages are illustrated using the confidence sets of example models. In this example, the models have two model parameters, parameter A 401 and parameter B 402, as shown in FIG. 4A. Accordingly, the confidence sets illustrated in the figures are two-dimensional, shown as ovals. However, as will be appreciated by those skill in the art, depending on the embodiment, different models may have more than two model parameters, and the confidence sets of the models may be a region in multi-dimensional space having more than just two dimensions. The example of two dimensions are used here for ease of illustration.

In FIG. 4A, the clear oval indicates the model parameter confidence set 410 of an active model, and the colored oval indicates the model parameter confidence set 420 of a recent model. As discussed, in some embodiments, the sequential decision system may use model executor (e.g., model executor 120) that updates two models (an active model and a recent model) in parallel. The active model may be used to make decisions of the decision system (e.g., select actions), and the recent model may be initiated occasionally or periodically to be updated alongside the active model, but only based on recent results of the active model's decisions.

As shown, in FIG. 4A, both of the confidence sets 410 and 412 may be ellipsoids centered around respective points 412 and 422. In some embodiments, the center 412 of the ellipsoid may represent the selected model parameter values that were used to make the last decision of the active model. The point 422 may represent optimal values of the parameters according to the learnings of the recent model. As discussed, in different embodiments, the confidence sets may be differently shaped (or in some cases disjoint), and the optimal parameter values may be a point in the confidence set other than the center. As shown, at this stage, the two models have diverged somewhat, but their confidence sets still overlap to a significant degree. Thus, at this point, depending on configuration, the decision system may determine that the active model should not be replaced. However, as time progresses, the two confidence sets will change in position and shape. In some embodiments, the confidence set of the recent model may change in a more volatile fashion, because its parameters are determined based on relatively few observations.

Figure 4B:
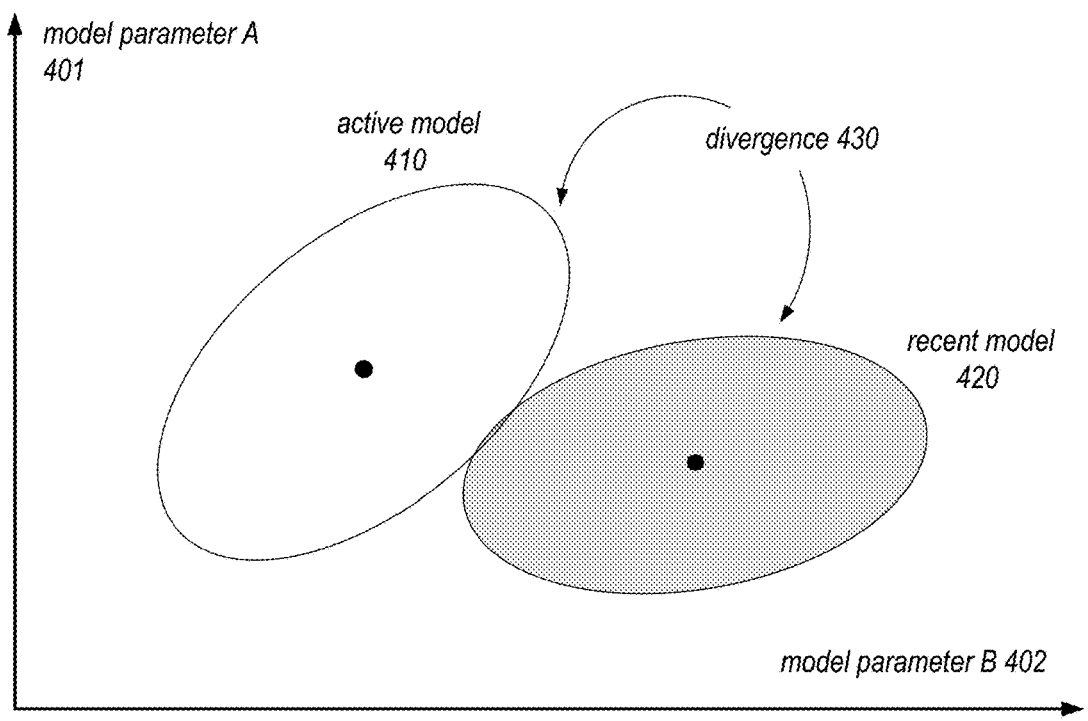

In FIG. 4B, a different stage of the two models is shown. At this point, the recent model 420 has moved so that it no longer overlaps with the active model 410. As discussed, this divergence 430 may indicate that the short-term behavior or characteristics of the modeled subject has changed, so that the active model is no longer reliable. In some embodiment, configuration settings of the system may indicate a triggering condition of when the two models are sufficiently different so that a replacement of the active model is necessary. In some embodiments, the triggering condition may be based on a degree of overlap in the volume of the two confidence sets. When the overlap falls below a threshold or reaches zero, the active model may be replaced.

The triggering condition may be defined different for different embodiments. In some embodiments, the triggering condition may not start until the recent model has been updated for a threshold number of iterations. In some embodiments, the triggering condition may be dependent on a distance between the two points of optimal parameter values between the two models. In some embodiments, the triggering condition may take into account the trend of the movement of the two models, for example, whether the two models are moving away from each other in recent decision steps or moving closer together. In some embodiments, the triggering condition may be dependent on the rate of the movement of the two confidence sets (e.g., whether their divergence is accelerating or decelerating). Depending on the embodiment, many other factors may be used to trigger the replacement of the active model. In the depicted example, the system may decide to replace the active model due to the lack of any overlap between the two confidence sets 410 and 420.

Figure 4C:
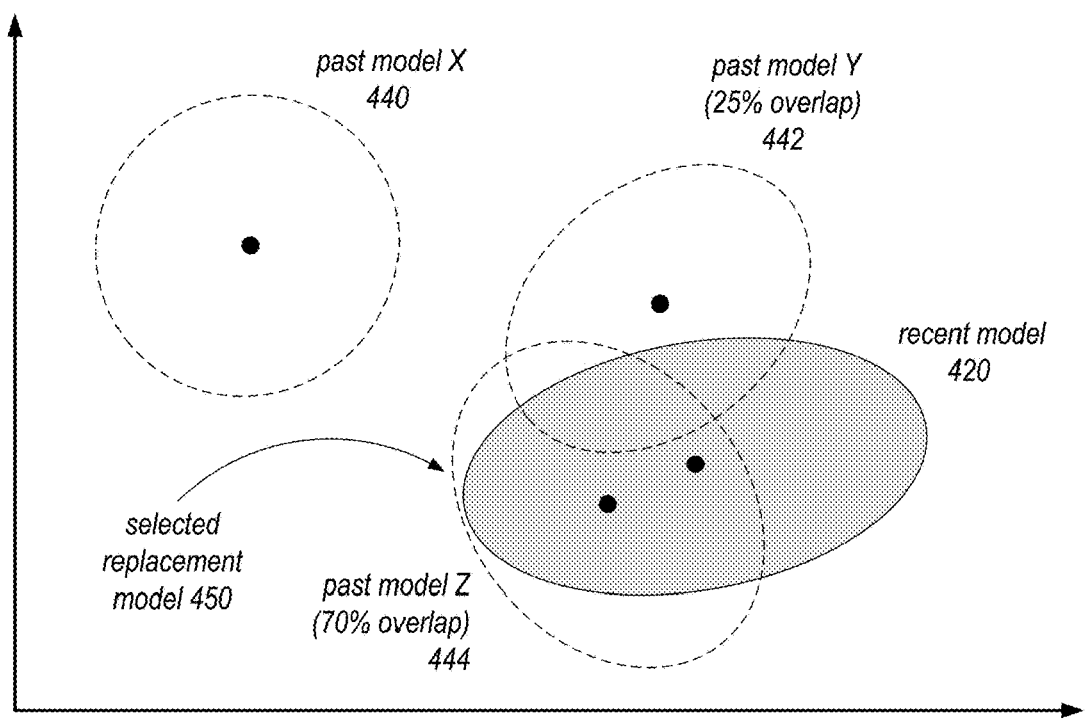

In FIG. 4C, after the determination that the active model should be replaced, the system examines a series of past models as potential candidate replacement models. As shown, the respective confidence sets of these past models are indicated as dashed ovals, including for past model X 440, past model Y 442, and past model Z 444. In some embodiments, in order to select the replacement model, a model selector may compare the confidence sets of these models with the confidence set of the recent model 420, to determine which model is the most similar to the recent model, which reflects current conditions of the subject. In this case, past model Z is the most similar because its confidence set 446 has the largest degree of overlap with the recent model confidence set. Thus, past model Z is selected as the replacement model 450.

The selection process may be different for different embodiments. For example, in some embodiments, any candidate model must satisfy a minimum similarity criterion with the recent model before it can be selected as the replacement model. In some embodiments, if no past models satisfy the minimum criteria, the recent model itself may be used as the replacement model. In some embodiments, other factors may be taken into account in selecting the replacement model. Such factors may include, for example, the past model's age or past performance. In some embodiments, the direction of movement of the recent model confidence set may be taken into account, so that a past model that is in the direction of the movement is preferred as the replacement model.

Figure 4D:
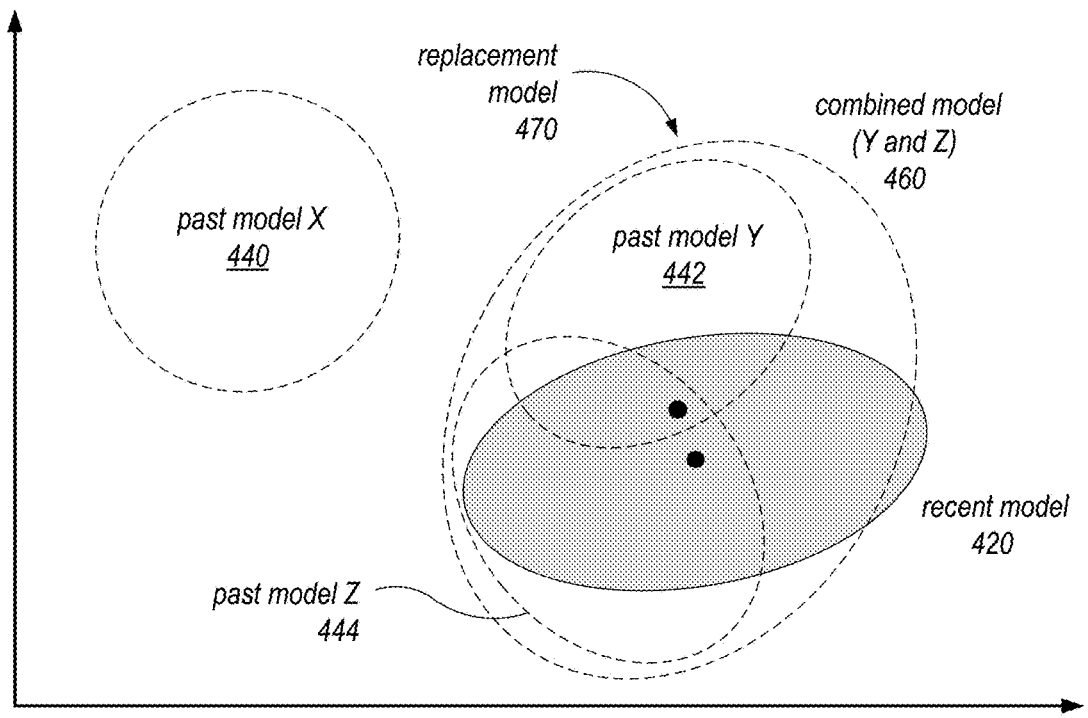

In FIG. 4D, a different manner of obtaining the replacement model is shown. In this example, instead of selecting one past model as the replacement model, multiple past models are combined to create a combined model 460, which is combined using models Y 442 and Z 444. The combined model is then used as the replacement model 470 to replace the active model. In some embodiments, a set of similar models may be selected, for example, based on the degree of the models' confidence sets with the recent model's confidence set 420. The set of similar model may then be combined. In some embodiments, the combination may be performed using an averaging technique, which averages various model parameters of the respective models. In some embodiments, the averaging may be weighted based on different factors, for example, based on the individual model's age or its past performance, etc. In some embodiments, the model selector may either select a single model or combine multiple models to obtain the replacement model, depending on the situation. For example, in some embodiments, where a single past model matches the recent model sufficiently well, that single model may be selected as the replacement model. On the other hand, if multiple past models are similar to the recent model to a roughly equal degree, or if no single model matches the recent model extremely well, the combination technique may be used.

Figure 5:
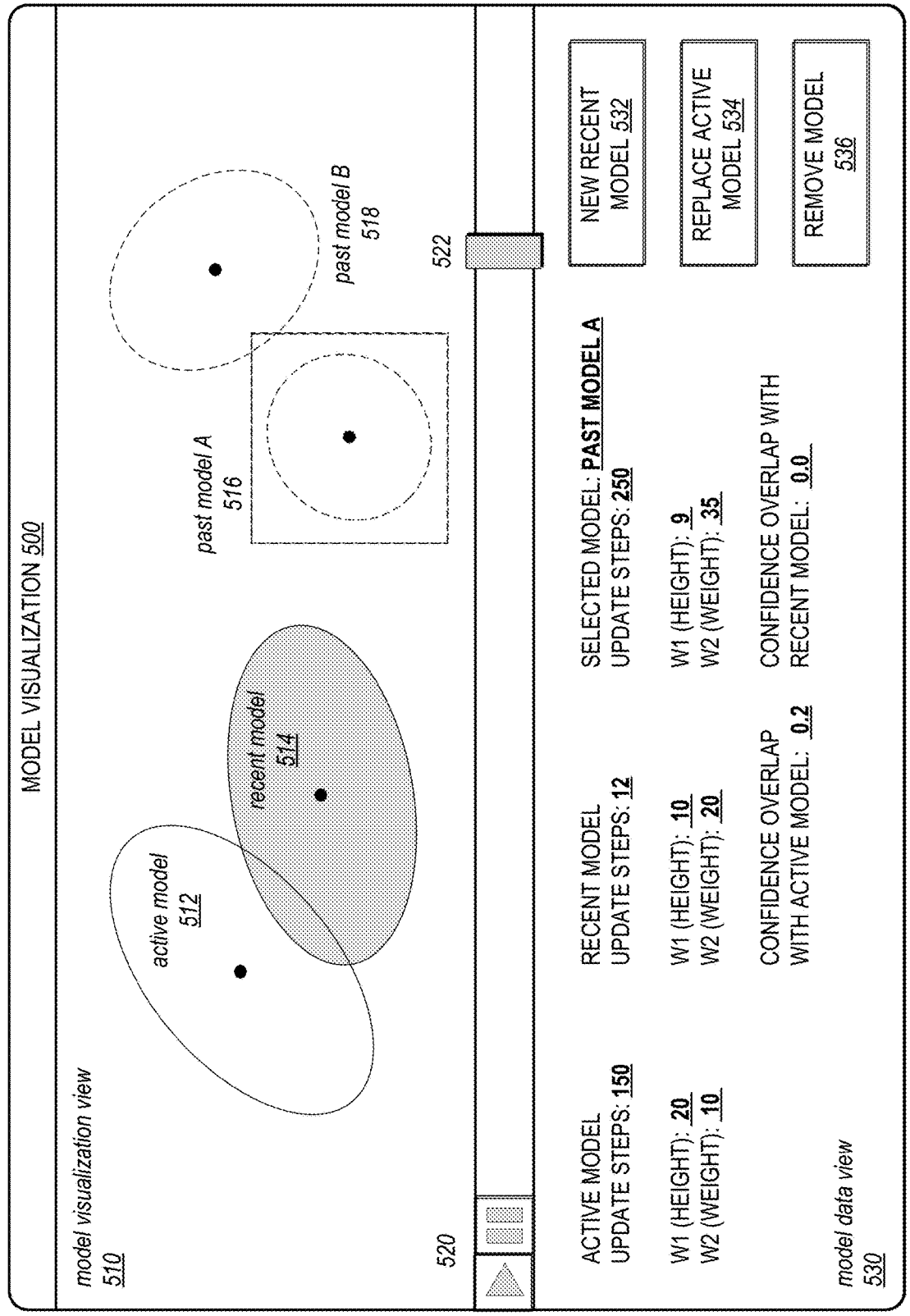
FIG. 5 illustrates a graphical user interface that is used to visualize and select different models in a sequential decision system, according to some embodiments.

FIG. 5 illustrates a graphical user interface that is used to visualize and select different models in a sequential decision system, according to some embodiments. In some embodiments, the model visualization user interface 500 may be implemented as part of the sequential decision system of FIG. 1. In some embodiments, the GUI 500 may be implemented as part of the machine learning service 340 of FIG. 3.

As shown, in some embodiments, the GUI 500 may include a model visualization view 510 and a model data view 530. In some embodiments, the model visualization view 510 may provide a visualization of the models maintained by the decision system, and the model data view 530 may display some of the data associated with particular ones of the models, as shown.

As shown, the model visualization view 510 may, in some embodiments, display the model parameter confidence sets of the different models in the system. In the depicted example, the respective confidence sets of the active model 512, the recent model 514, past model A 516, and past model B 518 are shown. As shown, past model A 516 is currently selected, so that its details are shown in the data model view as the selected model.

As may be understood, in some embodiments, the confidence sets of the models may be more than two dimensional. Thus, in some embodiments, the model visualization view 510 may show the confidence in three-dimensional or representations of higher dimensional views. In some embodiments, the visualization interface may allow a user to define how model confidence sets should be displayed. For example, in some embodiments, the interface may allow the user to specify a subset of the model parameters to use in to display the confidence set, or a specify a projection of the model parameters into 2D or 3D space.

As shown, in some embodiments, the visualization view 510 may include user controls to animate the movement of the confidence sets over time, such as controls 520 and 522. For example, control 520 may include a play button and a pause button, which can be used to play and pause the animation. The slide control 522 may be used to quickly move to a different point in the animation, for example. Thus, in some embodiments, the decision system may store or maintain the historical values of the confidence sets of its models. As discussed, in some embodiments, such historical data may be used to make model replacement or selection decisions. As shown, such historical data may also be used to generate an animation of the confidence sets, so that they can be played in the GUI 500.

As shown, the model data view 530 may display the data of multiple models. In this example, the data view 530 displays the data for the active model 512 (on the left), the recent model 514 (in the middle), and the selected model, which is past model A 516 (on the right). In this example, each of the models just two model parameters, which are show as W1 and W2, with correspond to parameter names HEIGHT and WEIGHT. In some embodiments, the model data may also include other metadata of the model, such as for example the number of update steps that the model has experienced during its existence. In some embodiments, as shown, the data view may also display a similarity metric between different model confidence sets. For example, as shown, the recent model 514 has a confidence overlap with the active model of 0.2, and past model A 516 has a confidence overlap with recent model of 0.0. These values may refer to a historical state of the models which correspond to the current frame of the animation in the visualization view 510. In some embodiments, as the animation plays, the corresponding values of the models may change with the animation. In some embodiments, the confidence metric may be a score or some other configurable value. As discussed, in some embodiments, this score or value may represent a similarity between two models and may be used by the sequential decision system to switch models.

As shown, the data view 530 may also include a number of buttons or other user elements to allow the user to modify the models in the system. In this example, the NEW RECENT MODEL button 532 may allow the user to manually start a new recent model. In some embodiments, the recent model 514 may be periodically initiated by the system to evaluate the active model. However, in some embodiments, the recent model may also be manually started via the GUI 500. As shown, the REPLACE ACTIVE MODEL button 534 may cause the active model 512 to be manually replaced by another model, such as for example the currently selected model. In some embodiments, the replacement operation may also cause the recent model 514 to be terminated. As shown, the data view 530 in this example also includes a REMOVE MODEL button 536. This button may allow the user to remove a model, for example the selected model, from the repository. A model may be removed for a variety of reasons, for example, if it is a model that is very unlike to become an active model, or if the model is redundant to another past model in the system, among other reasons.

As may be understood, the GUI 500 allows the user to easily visualize the models in the system and understand their similarities and dissimilarities in a visual way. With this visualization, the user is able to make better decisions about how the models should be changed or selected.

FIG. 6 illustrates a graphical user interface that is used to configure model selection behavior in a sequential decision system, according to some embodiments. In some embodiments, the model selection configuration interface 600 may provide user elements to allow a user to adjust configuration parameters to control the model switching process in the sequential decision system. In some embodiments, the interface 600 may be implemented as part of the sequential decision system of FIG. 1 or the machine learning interface 340 of FIG. 3.

In the depicted example, the configuration parameters are divided into multiple sections 610, 620, 630, and 640. In section 610, the GUI 600 allows the user to specify different properties of the recent model. For example, as shown, the recent model may be specified to be initiated or renewed every 3000 decision steps of the active model. In some embodiments, the frequency may be specified in terms of time, such as for example 1 week, etc. As shown, the recent model may also be limited in terms of the data from which its updates are calculated. In this example, updates to the recent model are to be based on a moving window of the last 300 decision steps. In this manner, the recent model may be configured to forget old data, so as to remain sensitive to new changes in the modeled subject.

In section 620, as shown, parameters may be specified to control the decision of when an active model should be replaced. Collectively, these parameters may define a trigger condition that triggers the replacement of the active model. As shown, in this example, the trigger condition occurs when the confidence overlap of the active model and the recent model falls below 0.10. In some embodiments, another part of the trigger condition may specify that the recent model must have undergo minimum number of update steps before it can trigger a model replacement. As may be understood, this configuration forces the system wait until the recent model is sufficiently mature until it is used to cause a replacement of the active model. In some embodiments, the details of this triggering condition are fully configurable. For example, the precise definition of the confidence set overlap metric may be configurable. As shown, the EDIT button 625 may allow the user to configure these details of the triggering condition.

In section 630, different configuration parameters are shown to configure the selection of a replacement model, when it is determined that the active model should be replaced. In this example, a past model qualifies as a candidate replacement model when it has experience more than 1000 update steps, and when its confidence set overlap with the recent model exceeds 0.75. As shown, the EDIT button 635 may allow details of the selection criteria to be configured.

In this example, as shown, the configuration does not attempt to average all qualifying models to generate the replace model, if there are multiple past models that satisfy the criteria. Thus, in this example, the qualifying models may be ranked according to the criteria, and a top model may be selected as the replacement model. In this example, as shown, in the event that no qualifying past models are found, the system may use the recent model as the replacement model.

In section 640, different configuration parameters are shown to retire past models. As discussed, in some embodiments, the past models in the model repository may be occasionally removed based on certain conditions. In this example, a past model is removed when it is either older than 1 year, or if it has not been used as the active model for more than 6 months. Thus, this configuration keeps the library of models to a small size by removing models that are not very useful or models that have existed for a long period of time. By performing these periodic removals, the model repository may be bounded to a small size, which reduces storage utilization by the decision system and also enhances performance during selection of the replacement model. As shown, details of the retirement criteria may be configured via the EDIT button 645.

Figure 7:
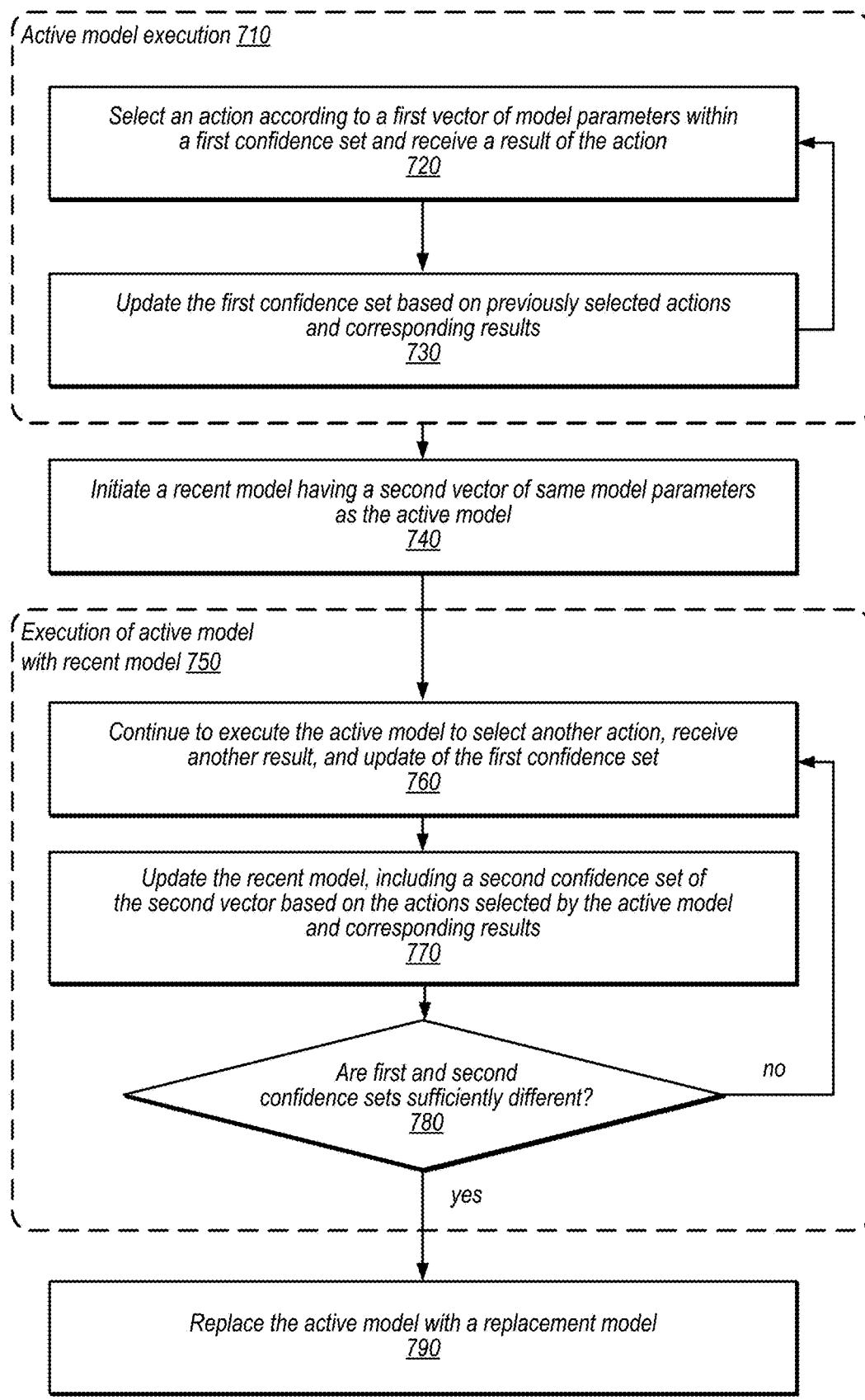
FIG. 7 is a flow diagram illustrating a process of replacing an active model in a sequential decision system based on a comparison of its model parameter confidence set with that of a recent model, according to some embodiments.

FIG. 7 is a flow diagram illustrating a process of replacing an active model in a sequential decision system based on a comparison of its model parameter confidence set with that of a recent model, according to some embodiments. The operations of FIG. 7 may be performed by, for example, the model executor 120 of FIG. 1.

As shown, the process in this example is divided into two phases 710 and 750. During the first phase 710, an active model is executed repeatedly without a recent model. In the second phase 750, the recent model is updated alongside the active model.

During the first phrase 710, an action is selected according to a first vector of model parameters within a confidence set, and a result of the action is received, at operation 720. Depending on embodiment, the selected action may comprise a variety of different actions. For example, in some embodiments, the selected action may indicate a selected content or content presentation to be delivered by a content delivery system. Thus, the content may specify a song in a song list or a web page layout to be provided by a web server. The results of the action may include feedback data that indicates a user's reaction to the provided content (e.g., whether the user interacted with the content, etc.) In some embodiments, the selected action may indicate a set of execution parameters to be used by an execution system to execute a particular task. In some embodiments, this execution system may comprise a network-accessible service that is executed using a computer system. In this case, the results of the action may indicate one or more metrics of the execution (e.g., the latency, CPU utilization, or performance of the execution). These uses cases of the active model are merely examples, and the active model may be used in a variety of different machine learning applications.

At operation 730, the first confidence set of model parameters of the active model is updated. The update may be based on previously selected actions and corresponding results of those actions. In some embodiments, the confidence set may comprise a confidence region in the parameter space of the model. In different embodiments, the confidence region may take on different shape including for example ellipsoids. In some embodiments, the confidence set may be computed as part of the decision-making process, and the model parameters that are used to make the last decision is selected from the confidence set. In some embodiments, the sequential decision model is an exploration-exploitation model that is attempting to learn information about the model subject and make the best decision to exploit the model subject at the same time. As shown, the phase 710 of the process repeats for multiple decision steps until operation 740.

At operation 740, a recent model is initiate, where the recent model ahs a second vector of the same model parameters as the active model. As discussed, the recent model may be updated along with the active model for a period of time and compared against the active model to determine if the active model is performing sufficiently well against the model subject in the short-term. In some embodiments, the recent model may be initiated on a regular basis, for example once a day, in order to evaluate the active model on a regular basis. Once the recent model is initiated, the process proceeds to the second phase 750.

During the second phase 750, execution of the active model is continued, to select another action, receive another result, and update the confidence set accordingly. This operation may be performed in similar fashion as in the first phase 710.

In addition, at operation 770, the recent model is also updated alongside the active model. This update may update a second confidence set of the second vector of model parameters of the recent model. The update may be based on the selected actions of the active model and corresponding results during the second phase 750. In some embodiments, this updating may occur in parallel with the updating of the active model. In some embodiments, as discussed, the active model may be updated in a production environment, while the recent model is updated in a test environment. In some embodiments, both models are updated in the same computer environment, via a model executor. As may be understood, while the active model is updating its model parameters based on its long-term learnings, the recent model's parameters only reflects the short-term learnings of the second phase.

At operation 780, a determination is made whether the first confidence set of the active model and the second confidence set of the recent model are sufficiently different. A different here may indicate that the two models' learnings are divergent, which suggests that the active model is not performing well against the recent behavior of the modeled subject. For example, in some embodiments, the two confidence sets may be deemed sufficiently if they fail to overlap at all, or when the degree of their overlap falls below some measurable threshold. In some embodiments, the difference condition may be configurable via a configuration interface. If the two confidence sets are not sufficiently different, the process continues to repeat in the second phase 750. If the two confidence sets are sufficiently different, the process proceeds to operation 790. As discussed, in some embodiments, the confidence sets of the two models may comprise posterior distributions of the models' respective parameters. These posterior distributions may reflect the probability distributions of the parameters, given the models' different observations. In some embodiments, two models may be deemed to be sufficiently different when their posterior distributions do not sufficiently overlap.

At operation 790, the active model is replaced with a replacement model. Thus, when the two confidence sets are sufficiently different, the system decides that the active model is not performing sufficiently well in the short-term. The system then replaces the active model with another model that is more likely to perform well. In some embodiments, the replacement model may be selected based on its similarity with the recent model. In some embodiments, the replacement model may be a past model saved in a model repository, or the recent model itself. In some embodiments, after the replacement, subsequent decisions by the sequential decision system are based on the replacement model. The active model that was replaced may no longer be updated or used to make further decisions. In some embodiments, the replaced active model may be stored in the model repository, where it will stay dormant until it is made active again in the future.

Figure 8:
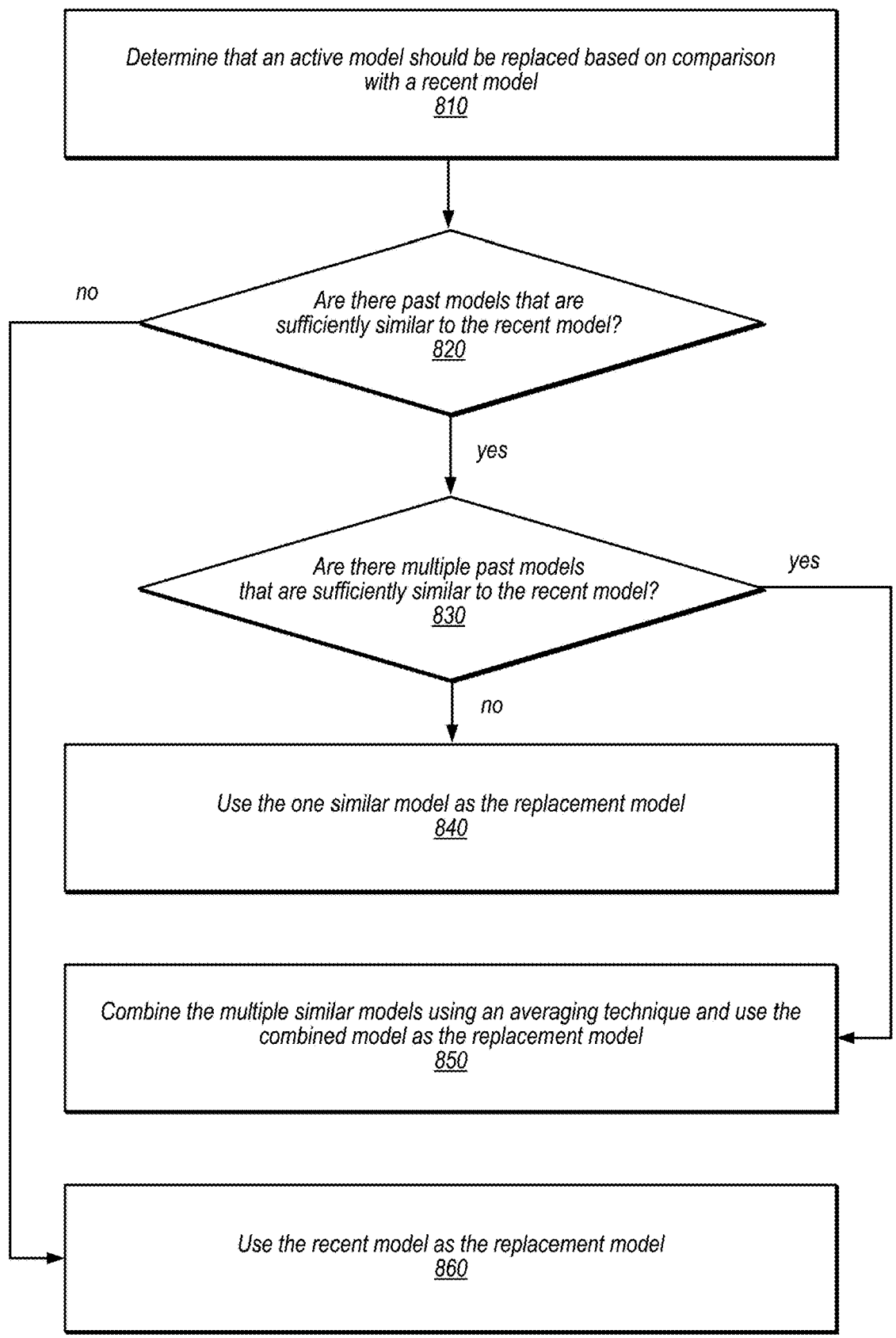
FIG. 8 is a flow diagram illustrating a process of selecting a model to replace an active model in a sequential decision system, according to some embodiments.

FIG. 8 is a flow diagram illustrating a process of selecting a model to replace an active model in a sequential decision system, according to some embodiments. In some embodiments, one or more operations of the depicted process may be performed by the replacement model selector 142, as discussed in connection with FIG. 1.

At operation 810, a determination is made that an active model of a sequential decision system should be replaced based on a comparison with a recent model. In some embodiments, this determination may be made in similar fashion as operation 780, as discussed in connection with FIG. 7.

At operation 820, a determination is made whether there are past models that are sufficiently similar to the recent model. In some embodiments, the respective model parameter confidence sets of the past models may be compared against the model parameter confidence set of the recent model. In some embodiments, two models may be deemed to be sufficiently similar based on a configurable similarity metric, which may be depending on a degree of overlap between the confidence sets of the two models. In some embodiments, the selection of past models may be based on other factors, such as the age of the model, the movement of the recent model, etc., among other things. In some embodiments, if multiple sufficiently similar past models are found, all such models may be added to a set, and the process proceeds to operation 830. On the other hand, if no sufficiently similar past models are found, the process proceeds to operation 860.

At operation 830, a determination is made whether there are multiple (i.e., more than one) past models that are sufficiently similar to the recent model. If no, the process proceeds to operation 840, where the single past model is used as a replacement model for the active model. The replacement of the active model may occur in similar fashion as discussed for operation 790 in FIG. 7. If yes, the process proceeds to operation 850.

At operation 850, the multiple similar past models are combined using an averaging technique, and the combined model is used as the replacement model. In some embodiments, the averaging technique may involve averaging the various model parameters of the multiple past models. In some embodiments, the averaging may be weighted, so that the parameters certain models are given more influence in the resulting model. For example, in some embodiments, models that have more learning experience (e.g., more update steps) may be given more weight. In some embodiments, models that are older may be given less weight. In some embodiments, models that are more similar to the recent model (e.g., larger overlap of confidence sets) may be given more weight.

As an alternative or addition to operation 850, in some embodiments, a top past model may be selected from the set of similar past models. In some embodiments, the process may rank the similar models according to a ranking criterion, which may be user configurable, and select the top past model as the replacement model. For example, in some embodiments, the ranking criteria may depend on a given model's similarity with the recent model or other characteristics of the given model. In some embodiments, the process may employ both a combining technique and a selection technique to produce the replacement model. In some embodiments, the selection technique may be used if there is a single clear winner in the set of similar past models, and the combining technique may be used where there is not a clear single winner. In some embodiments, both techniques may be used to select a replacement model from a single set of similar models.

At operation 860, if no sufficiently similar past models are found, in some embodiments, the recent model may be selected as the replacement model. Thus, for example, if the modeled subject is exhibiting a behavior that does not match any previously used models, the recent model is used to capture this new behavior and carry out the exploration-exploitation process on the new behavior.

Figure 9:
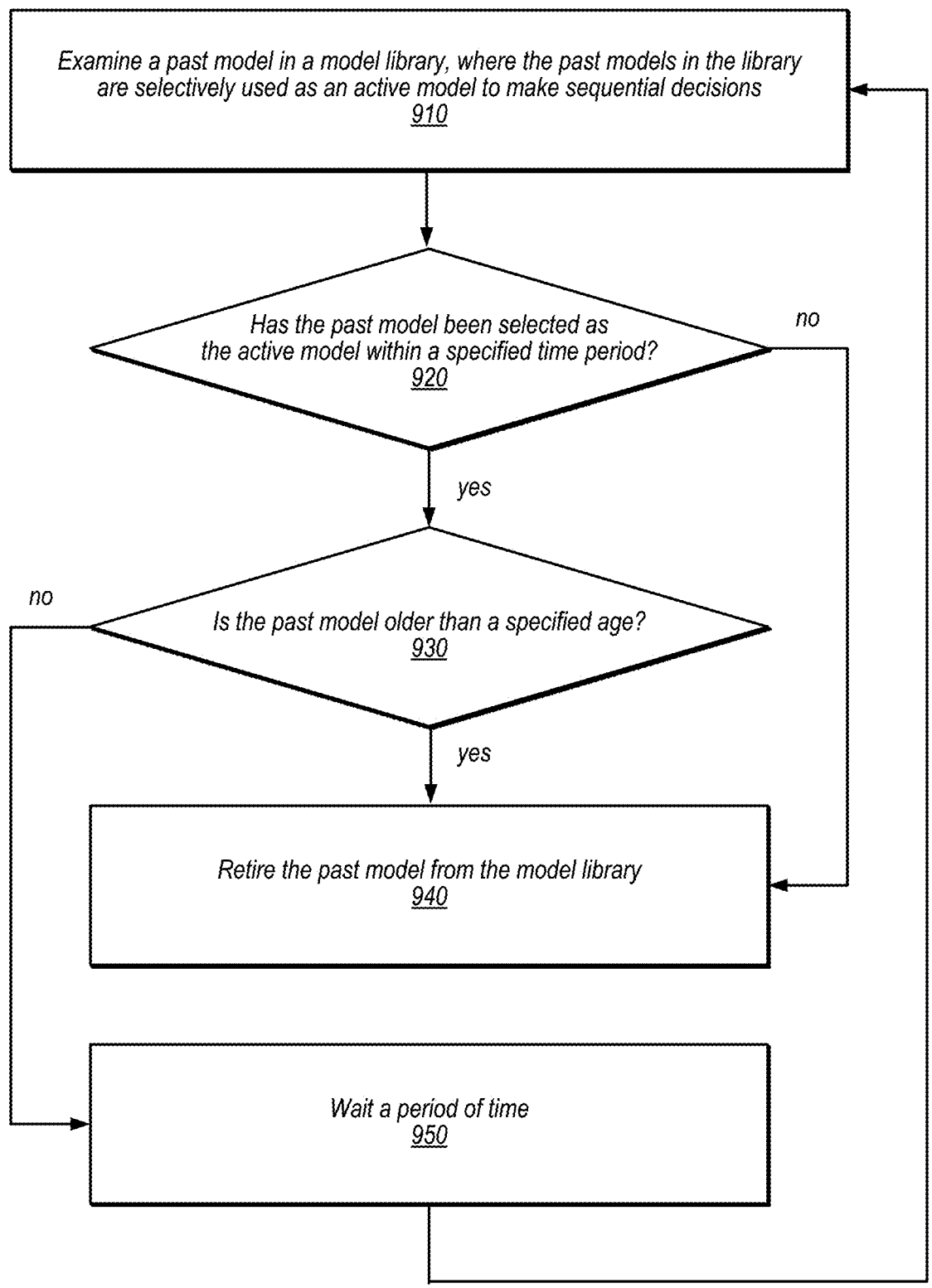
FIG. 9 is a flow diagram illustrating a process of deciding to retire a past model in a sequential decision system, according to some embodiments.

FIG. 9 is a flow diagram illustrating a process of deciding to retire a past model in a sequential decision system, according to some embodiments. In some embodiments, one or more operations of the depicted process may be performed by the model manager 146, as discussed in connection with FIG. 1.

At operation 910, a past model in a model library is examined. The past model may be a model that has been previously used as an active model in a sequential decision system, and the library may be used to store many past models in a model repository, for example, the model repository 150 of FIG. 1. In some embodiments, the models in the repository may be selectively reactivated as the active model of the decision system to make sequential decisions. In some embodiments, past models may be occasionally retired from the model library based on the examination. As discussed, the retirement bounds the size of the library to keep storage space utilization to a low level, and also reduces the amount of processing power that must be expended in maintaining and selecting past models for reactivation.

At operation 920, a determination is made whether the past model has been selected as the active model by the system within a specified time period. In some embodiments, if the a past model has not been selected as the active model, this may indicate that the past model is not particularly useful, and so the past model is a good candidate to be retired. Accordingly, if the answer is no, the process proceeds to operation 940, where the model is retired. If the answer is yes, the process proceeds to operation 930.

At operation 930, a determination is made whether the past model is older than a specified age. In some embodiments and depending on the configuration of the system, this determination may reflect another condition of retiring a past model. In some embodiments, an extremely old model may be undesirable for certain reasons. For example, in some embodiments, older models may persist for one or more factors, even though they are not the most optimal models for the modeled subject. In some embodiments, it is preferable to relearn the behavior of the model subject periodically, and new models that result from the relearning may be more optimal than old models that are merely satisfactory. Thus, in some embodiments, models that are older than a certain age may be removed to make way for newer models. Accordingly, if the answer is yes, the process proceeds to operation 940, where the past model is retired. If not, the process proceeds to operation 950.

At operation 950, the process simply waits for a period of time before repeating back to operation 910, where the past model is examined once again. Thus, the depicted process implements a loop, where the past model is repeatedly examined for retirement.

As may be understood, the two conditions for retirement in operations 920 and 930 are merely exemplary. Depending on the embodiment and the configuration of the system, different or additional retirement conditions may be employed. For example, in some embodiments, the models may be continually scored based on their similarity with successive generations of recent models. Models that have more similar to the recent models may be more likely retained, and models that are less similar may be removed. In some embodiments, a past model that is redundant to another superior model may be detected and removed.

Figure 10:
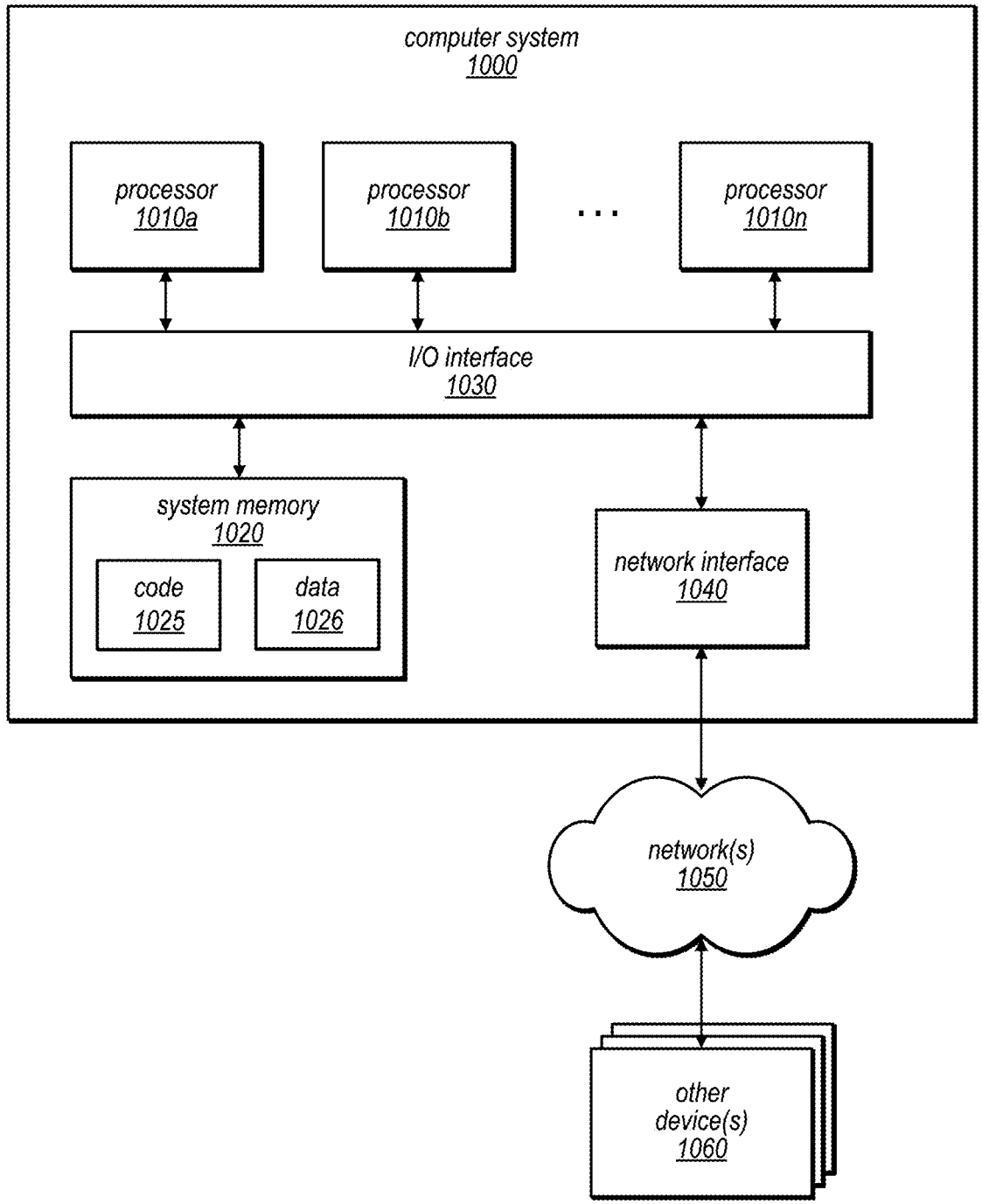
FIG. 10 is a block diagram illustrating an example computer system that can be used to host a sequential decision system that automatically switches models based on model parameter confidence sets, according to some embodiments.

FIG. 10 is a block diagram illustrating an example computer system that can be used to host one or more portions of a sequential decision system that automatically switches models based on model parameter confidence sets, according to some embodiments. Computer system 1000 may include or be configured to access one or more nonvolatile computer-accessible media. In the illustrated embodiment, computer system 1000 includes one or more processors 1010 coupled to a system memory 1020 via an input/output (I/O) interface 1030. Computer system 1000 further includes a network interface 1040 coupled to I/O interface 1030.

In various embodiments, computer system 1000 may be a uniprocessor system including one processor 1010, or a multiprocessor system including several processors 1010 (e.g., two, four, eight, or another suitable number). Processors 1010 may be any suitable processors capable of executing instructions. For example, in various embodiments, processors 1010 may be general-purpose or embedded processors implementing any of a variety of instruction set architectures (ISAs), such as the x86, PowerPC, SPARC, or MIPS ISAs, or any other suitable ISA. In multiprocessor systems, each of processors 1010 may commonly, but not necessarily, implement the same ISA.

System memory 1020 may be configured to store instructions and data accessible by processor(s) 1010. In various embodiments, system memory 1020 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as those methods, techniques, and data described above, are shown stored within system memory 1020 as code 1025 and data 1026. The system memory 1020 may include different levels of cache, some of which may be located on the CPU and some away from the CPU. One level of the cache hierarchy may be a last level cache that is shared by all of the processors 1010a to 1010n. The last level cache may be an inclusive cache of the low levels of cache in the cache hierarchy.

In one embodiment, I/O interface 1030 may be configured to coordinate I/O traffic between processor 1010, system memory 1020, and any peripheral devices in the device, including network interface 1040 or other peripheral interfaces. In some embodiments, I/O interface 1030 may perform any necessary protocol, timing or other data transformations to convert data signals from one component (e.g., system memory 1020) into a format suitable for use by another component (e.g., processor 1010). In some embodiments, I/O interface 1030 may include support for devices attached through various types of peripheral buses, such as a variant of the Peripheral Component Interconnect (PCI) bus standard or the Universal Serial Bus (USB) standard, for example. In some embodiments, the function of I/O interface 1030 may be split into two or more separate components, such as a north bridge and a south bridge, for example. Also, in some embodiments some or all of the functionality of I/O interface 1030, such as an interface to system memory 1020, may be incorporated directly into processor 1010.

Network interface 1040 may be configured to allow data to be exchanged between computer system 1000 and other devices 1060 attached to a network or networks 1050, such as other computer systems or devices, such as routers and other computing devices, as illustrated in FIGS. 1 through 10, for example. In various embodiments, network interface 1040 may support communication via any suitable wired or wireless general data networks, such as types of Ethernet network, for example. Additionally, network interface 1040 may support communication via telecommunications/telephony networks such as analog voice networks or digital fiber communications networks, via storage area networks such as Fibre Channel SANs, or via any other suitable type of network and/or protocol.

In some embodiments, system memory 1020 may be one embodiment of a computer-accessible medium configured to store program instructions and data as described above for FIGS. 1 through 10 for implementing embodiments of methods and apparatus for traffic analysis. However, in other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computer system 1000 via I/O interface 1030. A non-transitory computer-accessible storage medium may also include any volatile or non-volatile media such as RAM (e.g. SDRAM, DDR SDRAM, RDRAM, SRAM, etc.), ROM, etc, that may be included in some embodiments of computer system 1000 as system memory 1020 or another type of memory. Further, a computer-accessible medium may include transmission media or signals such as electrical, electromagnetic, or digital signals, conveyed via a communication medium such as a network and/or a wireless link, such as may be implemented via network interface 1040.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. A system comprising:
one or more computers that implement a model executor, configured to;
execute an active model having a first vector of model parameters to, in individual time periods:

select an action for the time period according to the first vector of model parameters, wherein the first vector of model parameters is selected from a first confidence set;
receive a result of the action; and
update the first confidence set based at least in part on previously selected actions of the active model and their corresponding results;
initiate a recent model having a second vector of same model parameters as the first vector of the active model and, in individual subsequent time periods:
continue to execute the active model to select a subsequent action, receive a subsequent result, and update the first confidence set; and
update the recent model along with the active model, including a second confidence set of the second vector based at least in part on subsequent actions selected by the active model and corresponding subsequent results in the subsequent time periods; and
responsive to a determination that the first and second confidence sets are sufficiently different, replace the active model with a replacement model, wherein additional actions are selected according to the replacement model.

2. The system of claim 1, wherein to replace the active model, the model executor is configured to replace the active model with the recent model.

3. The system of claim 1, wherein the model executor is configured to:
determine a set of past models that are sufficiently similar to the recent model based at least in part on the second confidence set of the recent model and the past models' respective confidence sets of model parameters; and
select one model from the set as the replacement model.

4. The system of claim 1, further comprising a model repository that stores the set of past models, and wherein the model executor is configured to:
store the active model that was replaced as a past model in the model repository, wherein the past model is not updated;
responsive to a determination that the past model is sufficiently similar to another recent model based at least in part on respective confidence sets of model parameters of the past model and the other recent model, replace a current active model with the past model; and
responsive to a determination that the past model is older than a threshold age or has not been active in a threshold period of time, delete the past model from the model repository.

5. The system of claim 1, wherein:
to select the action, the model executor is configured to select a content to be delivered to a client; and
to receive the result of the action, the model executor is configured to receive user feedback data from the client for the content.

6. A method comprising:
executing an active model having a first vector of model parameters, wherein the execution includes performing, in individual time periods:
selecting an action for the time period according to the first vector of model parameters, wherein the first vector of model parameters is selected from a first confidence set;
receiving a result of the action; and
updating the first confidence set based at least in part on previously selected actions of the active model and their corresponding results;
initiating a recent model having a second vector of same model parameters as the first vector of active model and in individual subsequent time periods:
continuing to execute the active model to select a subsequent action, receive a subsequent result, and update the first confidence set; and
updating the recent model along with the active model, including a second confidence set of the second vector based at least in part on subsequent actions selected by the active model and corresponding subsequent results in the subsequent time periods; and
responsive to a determination that the first and second confidence sets are sufficiently different, replacing the active model with a replacement model, wherein additional actions are selected according to the replacement model.

7. The method of claim 6, wherein replacing the active model comprises replacing the active model with the recent model.

8. The method of claim 6, further comprising:
determining a set of past models that are sufficiently similar to the recent model based at least in part on the second confidence set of the recent model and the past models' respective confidence sets of model parameters; and
selecting one model from the set as the replacement model.

9. The method of claim 8, wherein the set of past models are retrieved from a model repository, and further comprising:
storing the active model that was replaced as a past model in the model repository, wherein the past model is not updated; and
responsive to a determination that the past model is sufficiently similar to another recent model based at least in part on respective confidence sets of respective model parameters of the stored model and the other recent model, replacing a current active model with the past model.

10. The method of claim 9, further comprising:
responsive to a determination that the past model is older than a threshold age or has not been active in a threshold period of time, deleting the past model from the model repository.

11. The method of claim 6, further comprising:
determining a plurality of past models that are sufficiently similar to the recent model based on the second confidence set and the past models' respective confidence sets of model parameters; and
combining the plurality of past models using an averaging technique to generate the replacement model.

12. The method of claim 6, wherein:
selecting the action comprises selecting a content to be delivered via a user interface; and
receiving the result of the action comprises receiving user feedback data from the user interface after the content was delivered.

13. The method of claim 6, wherein updating the recent model comprises:
updating the recent based on a moving window of most recent actions and corresponding results in the subsequent time periods.

14. The method of claim 6, further comprising:
providing a machine learning service that hosts a plurality of machine learning models for a plurality of respective clients;
receiving, at the machine learning service, one or more configuration parameters that controls the replacing of the active model; and
performing, via the machine learning service, the replacing of the active model according to the one or more parameters.

15. The method of claim 6, further comprising:
displaying, via a graphical user interface, an animation of the first confidence set of the active model and the second confidence set of the recent model.

16. A non-transitory computer-accessible storage medium storing program instructions that when executed on one or more processors cause the one or more processors to:
execute an active model that has a first vector of model parameters to, in individual time periods:
select an action for the time period according to the first vector of model parameters, wherein the first vector of model parameters is selected from a first confidence set;
receive a result of the action; and
update the first confidence set based at least in part on previously selected actions of the active model and their corresponding results;
initiate a recent model having a second vector of same model parameters as the first vector of active model and in individual subsequent time periods:
continue to execute the active model to select a subsequent action, receive a subsequent result, and update the first confidence set; and
update the recent model along with the active model, including a second confidence set of the second vector based at least in part on subsequent actions selected by the active model and corresponding subsequent results in the subsequent time periods; and
responsive to a determination that the first and second confidence sets are sufficiently different, replace the active model with a replacement model, wherein additional actions are selected according to the replacement model.

17. The non-transitory computer-accessible storage medium of claim 16, wherein to replace the active model, the program instructions when executed on one or more processors cause the one or more processors to replace the active model with the recent model.

18. The non-transitory computer-accessible storage medium of claim 16, wherein to replace the active model, the program instructions when executed on one or more processors cause the one or more processors to:
replace the active model with a past model, wherein the past model is sufficiently similar to the recent model based at least in part on the second confidence set of the recent model and the past model's confidence set of model parameters.

19. The non-transitory computer-accessible storage medium of claim 16, wherein the program instructions when executed on one or more processors cause the one or more processors to:
store the active model that was replaced as a past model in a model repository, wherein the past model is not updated;
responsive to a determination that the past model is sufficiently similar to another recent model based at least in part on respective confidence sets of model parameters of the past model and the other recent model, replace a current active model with the past model.

20. The non-transitory computer-accessible storage medium of claim 16, wherein to update the first and second confidence sets, the program instructions when executed on one or more processors cause the one or more processors to:
determine respective posterior distributions of at least some of the model parameters for the active model and at least some of the model parameters of the recent model; and
wherein the determination that the first and second confidence sets are sufficiently different is made based at least in part on a degree of overlap between the posterior distributions.

* * * * *